(12) United States Patent
Weng et al.

(10) Patent No.: US 8,824,535 B2
(45) Date of Patent: Sep. 2, 2014

(54) SYSTEM AND METHOD FOR TRANSMITTING DATA THROUGH A DIGITAL INTERFACE

(75) Inventors: Jianfeng Weng, Kanata (CA); Yangwen Liang, Waterloo (CA); Xing Qian, Conestogo (CA); Qing Feng Xu, Waterloo (CA); Christopher Eugene Snyder, Waterloo (CA)

(73) Assignee: BlackBerry Limited, Waterloo, Ontario (CA)

( * ) Notice: Subject to any disclaimer, the term of this patent is extended or adjusted under 35 U.S.C. 154(b) by 79 days.

(21) Appl. No.: 13/477,693

(22) Filed: May 22, 2012

(65) Prior Publication Data

US 2013/0315288 A1    Nov. 28, 2013

(51) Int. Cl.
*H04B 3/46*    (2006.01)

(52) U.S. Cl.
USPC ...... 375/227; 455/135; 455/161.3; 455/277.2

(58) Field of Classification Search
None
See application file for complete search history.

(56) References Cited

U.S. PATENT DOCUMENTS

| | | | |
|---|---|---|---|
| 7,009,533 B1 | 3/2006 | Wegener | |
| 7,835,435 B2 * | 11/2010 | Soni et al. | 375/240 |
| 8,102,937 B2 | 1/2012 | Helfenstein et al. | |
| 8,121,573 B2 | 2/2012 | Haralabidis et al. | |
| 2009/0122844 A1 | 5/2009 | Wenzel et al. | |
| 2009/0161529 A1 | 6/2009 | Speth | |
| 2010/0034192 A1 | 2/2010 | Beamish et al. | |
| 2010/0074311 A1 | 3/2010 | Kopmeiners | |
| 2010/0135275 A1 | 6/2010 | Storm et al. | |
| 2011/0135013 A1 * | 6/2011 | Wegener | 375/241 |
| 2011/0206143 A1 | 8/2011 | Reinhardt et al. | |

FOREIGN PATENT DOCUMENTS

| | | |
|---|---|---|
| EP | 2 204 930 A1 | 7/2010 |
| EP | 2 254 256 A2 | 11/2010 |
| EP | 2493106 A1 | 8/2012 |

OTHER PUBLICATIONS

Borges, Pedro, European Search Report for European Application No. 12168943.4-1237; Search completed Sep. 14, 2012; published Sep. 26, 2012; published by the European Patent Office; 6 pages.

Author Unknown, Agilent Technologies, Inc., "DigRF v4 Analysis Tools User's Guide", 50 pages, published Dec. 15, 2009 by Agilent Technologies, Inc., 1900 Garden of the Gods Road, Colorado Springs, CO 80907 USA.

Author Unknown, DigRF(SM) Specifications MIPI Alliance, "MIPI® Alliance Advances Radio Frequency Interface Technology in Mobile Devices", available at http://www.mipi.org/specifications/digrfsm-specifications, published in 2012 and retrieved on Apr. 13, 2012, 7 pages.

(Continued)

*Primary Examiner* — Adolf Dsouza

(57) ABSTRACT

There are disclosed systems and methods that dynamically vary the word length of data being transmitted through a digital interface. In one embodiment, the method comprises: (i) obtaining at least one parameter indicative of a quality of a signal; (ii) if the at least one parameter indicates that the quality of the signal is above a threshold, then transmitting the data as a number of digital words at a first predetermined word length; (ii) if the at least one parameter indicates that the quality of the signal is below the threshold, then transmitting the data as a number of digital words at a second predetermined word length. The second predetermined word length is different from the first predetermined word length.

20 Claims, 17 Drawing Sheets

(56) References Cited

OTHER PUBLICATIONS

Lathrop, Richard, "Using ATE for Efficient DigRF Interface Testing", Sep. 2008, available at http://www.evaluationengineering.com/search/article.php?aid=5111, retrieved on Mar. 27, 2012, 10 pages.

Author Unknown, Physical Layer Specifications MIPI Alliance, "MIPI Alliance Launches M-PHY v1.0 + UniPro v 1.40 Specifications", available at http://www.mipi.org/specifications/physical-layer, published in 2010 and retrieved on Mar. 27, 2012, 6 pages.

Author Unknown, Knowledge Transfer, "Definition: 8b/10b encoding", available at http://www.knowledgetransfer.net/dictionary/Storage/en/8b10b_encoding.htm, published in 2010 and retrieved on Apr. 13, 2012, 3 pages.

* cited by examiner

SYSTEM AND METHOD FOR TRANSMITTING DATA THROUGH A DIGITAL INTERFACE

FIELD

The following relates to the transfer of digital data through a digital interface.

BACKGROUND

In many mobile devices, the radio frequency (RF) transceiver and the baseband (BB) processing functions are often implemented in separate integrated circuits (ICs). The RF transceiver typically performs analog signal processing, as well as either analog-to-digital conversion (in the receive path) or digital-to-analog conversion (in the transmit path). The BB processing typically implements digital processing, such as demodulation and decoding (in the receive path) and modulation and encoding (in the transmit path).

The RF IC and the BB IC communicate via a digital interface. The digital interface is used to transfer the digital data and any associated control information between the RF IC and the BB IC.

A DigRF interface (such as the MIPI Alliance Specification for DigRF v4) is an example of a standard that defines a digital interface between an RF IC and a BB IC.

BRIEF DESCRIPTION

Embodiments of the present application will be described, by way of example only, with reference to the accompanying figures wherein.

Like reference numerals are used in different figures to denote similar elements.

DETAILED DESCRIPTION

Figure 1:
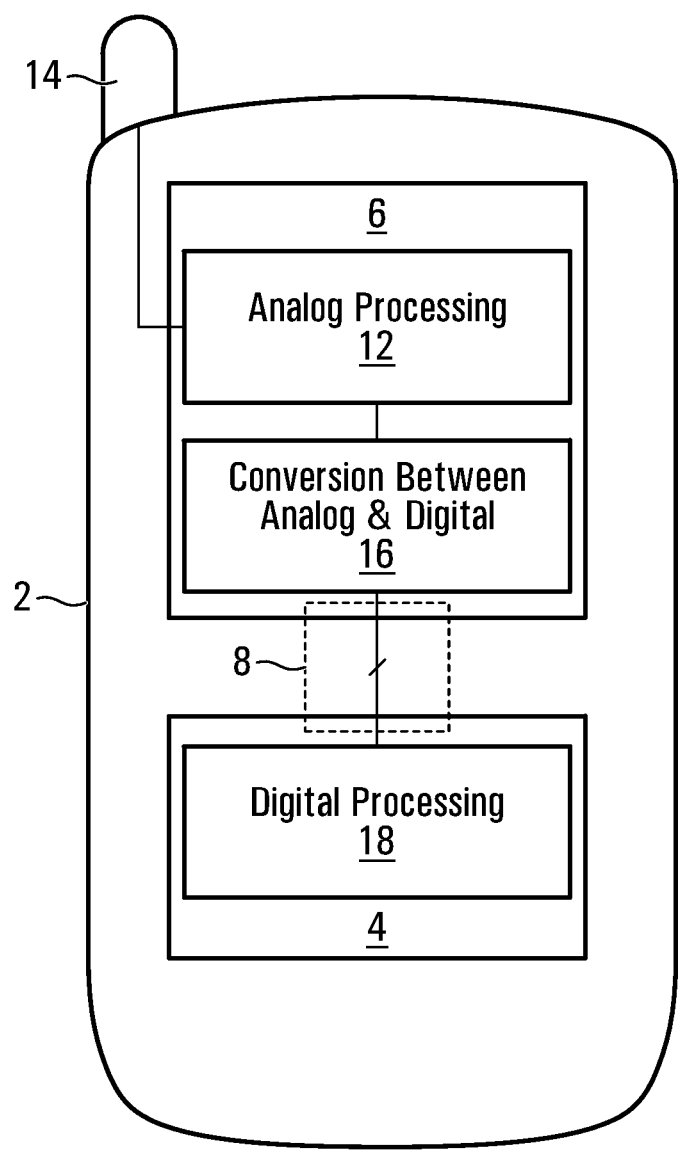
FIG. 1 is a block diagram of a device.

In general, there are disclosed systems and methods that dynamically vary the word length of digital words being transmitted through a digital interface. The word length is varied based on at least one parameter indicative of a quality of a signal.

For example, in one embodiment, the signal is received by a device and the digital words are extracted from the signal. One or more parameters indicative of the quality of the signal (e.g. the signal to noise ratio (SNR)) are monitored, and if the one or more parameters indicate that the quality of the signal has changed such that it is within another window of quality (i.e. such that the quality has moved above or below a threshold), the word length of the digital words being transferred through the digital interface is modified.

As another example, in another embodiment, the signal is used to transmit the digital words from the device. One or more parameters indicative of the quality of the signal being transmitted (such as, for example, the modulation scheme, the transmission power, the SNR of the transmitted signal, or a signal-to-quantization noise ratio (SQNR)) are monitored, and if the one or more parameters indicate that the quality of the transmitted signal has changed such that it is within another window of quality (i.e. such that the quality has moved above or below a threshold), the word length of the digital words being transferred through the digital interface is modified.

In both of these described example embodiments, different possible word lengths for the digital words are predetermined, so that switching between a first word length and a second word length can be performed during operation by simply indicating which predetermined word length should be used. For example, in one example implementation specific to a DigRF interface, a first logical channel is preconfigured to represent the digital words using a first word length, and a second logical channel is preconfigured to represent the digital words using a second word length. During operation, when it is determined that the word length can or should be changed, the word length is modified on the fly by switching to the second logical channel, which can be achieved by simply specifying the second logical channel using the logical index in the header of each DigRF frame.

A few general embodiments will now be described before considering specific example embodiments in relation to the figures.

In some embodiments, there is provided a method of transmitting data through a digital interface. The method comprises: (i) obtaining at least one parameter indicative of a quality of a signal; (ii) if the at least one parameter indicates that the quality of the signal is above a threshold, then transmitting the data as a number of digital words at a first predetermined word length; (iii) if the at least one parameter indicates that the quality of the signal is below the threshold, then transmitting the data as a number of digital words at a second predetermined word length. The second predetermined word length is different from the first predetermined word length.

In some embodiments, there is provided another method of transmitting data through a digital interface. The method comprises: (i) obtaining at least one parameter indicative of a quality of a signal; (ii) if the at least one parameter indicates that the quality of the signal is within a first window of quality, then transmitting the data as a number of digital words at a first predetermined word length; (iii) if the at least one parameter indicates that the quality of the signal is within a second window of quality different from the first window, then transmitting the data as a number of digital words at a second predetermined word length, the second predetermined word length different from the first predetermined word length.

In some embodiments, there is provided yet another method of transferring digital words through a digital interface. The method comprises: (i) obtaining at least one parameter indicative of a quality of a signal during the transferring of the digital words; (ii) if the at least one parameter indicates that the quality of the signal is within a first window of quality, then transferring a plurality of the digital words through the digital interface at a first predetermined word length; (iii) if the at least one parameter indicates that the quality of the signal is within a second window of lower quality than the first window, then transferring the plurality of the digital words through the digital interface at a second predetermined word length. The second predetermined word length is less than the first predetermined word length.

In some embodiments, there is provided a mobile device comprising a digital interface through which the mobile device is configured to transmit data. The mobile device also comprises a memory for storing predetermined word lengths, including a first predetermined word length and a second predetermined word length that is different from the first predetermined word length. The mobile device further comprises a signal quality determiner for determining at least one parameter indicative of a quality of a signal. The mobile device further comprises a word length selector for: (i) if the at least one parameter indicates that the quality of the signal is above a threshold, then selecting the first predetermined word length such that the data is transmitted as a number of digital words at the first predetermined word length; (ii) if the at least one parameter indicates that the quality of the signal is below the threshold, then selecting the second predetermined word length such that the data is transmitted as a number of digital words at the second predetermined word length.

In some embodiments, there is provided another mobile device comprising a digital interface through which the mobile device is configured to transmit data. The mobile device also comprises a memory for storing predetermined word lengths, including a first predetermined word length and a second predetermined word length that is different from the first predetermined word length. The mobile device further comprises a signal quality determiner for determining at least one parameter indicative of a quality of a signal. The mobile device further comprises a word length selector for: (i) if the at least one parameter indicates that the quality of the signal is within a first window of quality, then selecting the first predetermined word length such that the data is transmitted as a number of digital words at the first predetermined word length; and (ii) if the at least one parameter indicates that the quality of the signal is within a second window of quality different from the first window, then selecting the second predetermined word length such that the data is transmitted as a number of digital words at the second predetermined word length.

In some embodiments, there is provided yet another mobile device comprising a digital interface through which the mobile device is configured to transfer digital words. The mobile device also comprises a memory for storing predetermined word lengths, including a first predetermined word length and a second predetermined word length that is less than the first predetermined word length. The mobile device further comprises a signal quality determiner for, during the transfer of the digital words through the digital interface, determining at least one parameter indicative of a quality of a signal. The mobile device further comprises a word length selector for: (i) if the at least one parameter indicates that the quality of the signal is within a first window of quality, then selecting the first predetermined word length such that a plurality of the digital words are transferred through the digital interface at the first predetermined word length; and (ii) if the at least one parameter indicates that the quality of the signal is within a second window of lower quality than the first window, then selecting the second predetermined word length such that the plurality of the digital words are transferred through the digital interface at the second predetermined word length.

In some embodiments, there is provided a computer readable medium having stored thereon computer readable instructions that, when executed, cause a device to perform any one of the methods described herein.

For illustrative purposes, some specific example embodiments will now be explained in greater detail below in conjunction with the figures.

The embodiments set forth herein represent the necessary information to practice the claimed subject matter and illustrate the best way of practicing such subject matter. Upon reading the following description in light of the accompanying figures, those of sufficient skill will understand the concepts of the claimed subject matter and will recognize applications of these concepts not particularly addressed herein. It should be understood that these concepts and applications fall within the scope of the disclosure and the accompanying claims.

Moreover, it will be appreciated that any module, component, or device exemplified herein that executes instructions may include or otherwise have access to computer readable storage medium or media for storage of information, such as computer readable instructions, data structures, program modules, or other data. A non-exhaustive list of examples of computer readable storage media include magnetic cassettes, magnetic tape, magnetic disk storage or other magnetic storage devices, optical disks such as CD-ROM, DVDs, Blu-ray, or other optical storage, volatile and non-volatile, removable and non-removable media implemented in any method or technology, RAM, ROM, EEPROM, flash memory or other memory technology. Any such computer storage media may be part of the device or accessible or connectable thereto. Any application or module herein described may be implemented using computer readable/executable instructions that may be stored or otherwise held by such computer readable storage media.

Referring first to FIG. 1, an example of a device 2 is illustrated. The device 2 includes a first integrated circuit (IC) 4 and a second IC 6, which communicate via a digital interface 8. In the illustrated embodiment, the device 2 is a mobile device, and the digital interface 8 is part of the communication subsystem of the mobile device 2. However, it will be appreciated that in general the digital interface 8 need not be limited to a mobile device (or a communication system), but can be any digital interface for transmitting (i.e. transferring) digital data between two circuits.

The mobile device 2 of the illustrated embodiment includes one or more antennas 14 connected to the second IC 6. The second IC 6 performs analog processing 12 and analog-to-digital conversion 16 between an analog signal and digital words. The first IC 4 performs digital processing 18 on the digital words. The digital words are transferred between the first IC 4 and the second IC 6 through the digital interface 8.

The mobile device 2 includes many other details, which have been omitted for the sake of clarity. For example, in some embodiments, the mobile device includes some or all of the details shown in the example embodiment illustrated in FIG. 17.

Figure 2:
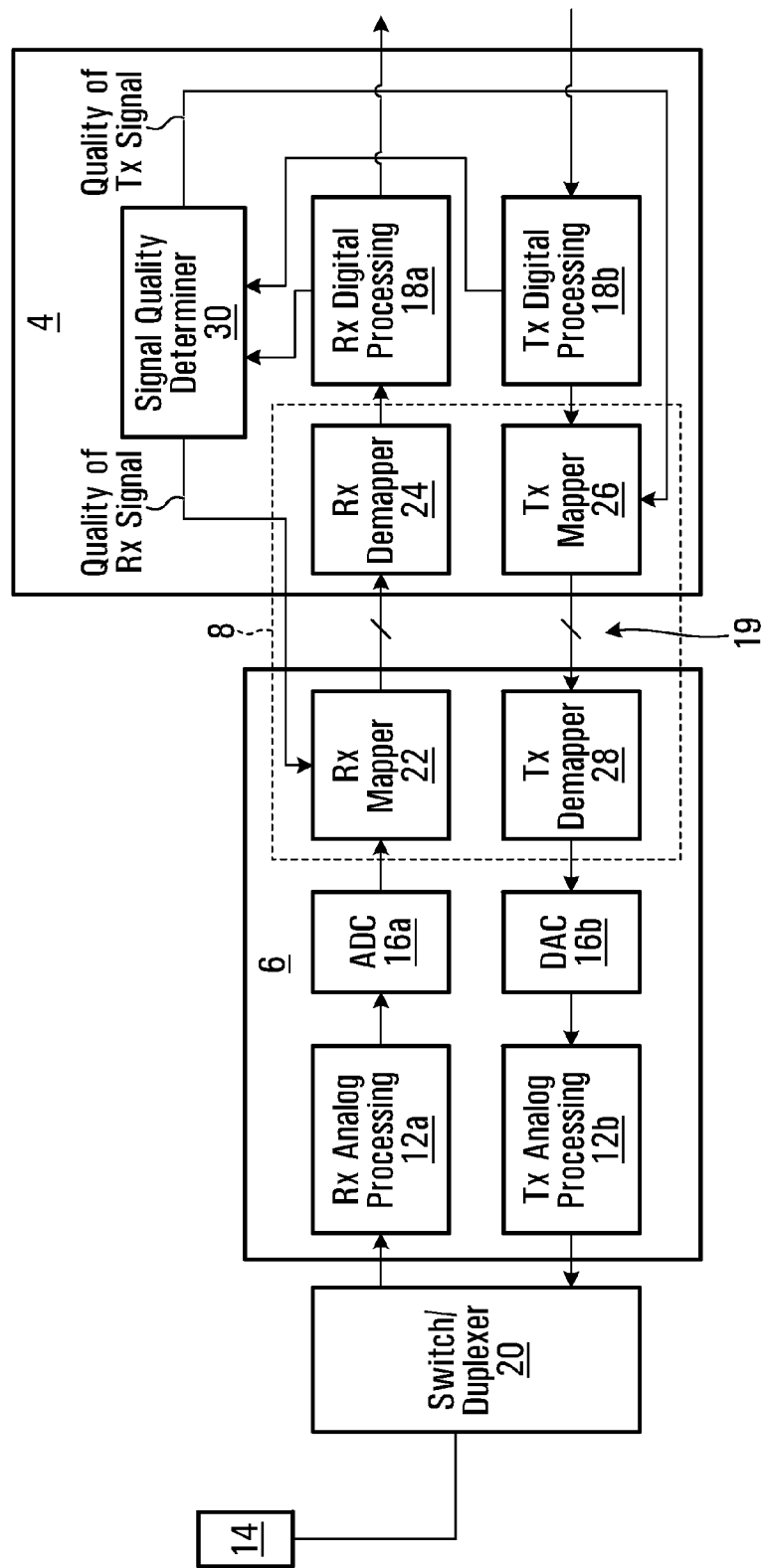
FIG. 2 illustrates the digital interface of the device in more detail.

The first IC 4 and the second IC 6 are illustrated in greater detail in FIG. 2. On the receive path, the analog signal received at antenna(s) 14 is fed through the switch and duplexer 20 to the receive chain, which includes analog processing 12a (such as, for example, down-conversion, filtering, and programmable gain control). The analog signal is then sampled in an analog-to-digital converter (ADC) 16a. The output of the ADC 16a is digital words, which are digital samples. In some embodiments, additional digital front-end processing (not shown), such as filtering and digital gain control, is performed on the ADC output, and the output from the additional digital front-end processing is the digital words sent to the Rx mapper 22. In some embodiments, the digital words are the in-phase (I) and quadrature-phase (Q) components, which are representative of the received constellation symbols that are to be demodulated and decoded in order to allow the mobile device 2 to make a decision as to what information was transmitted. The word length of each of the digital words (e.g. the number of digital bits used to represent each digital word) is typically fixed at the ADC 16a and fixed in the digital front-end processing (not shown).

After the ADC 16a, the digital words are sent to mapper 22, which maps each of the digital words to a particular predetermined word length that is selected in the manner described later. In one embodiment, mapping each of the digital words to a selected predetermined word length is achieved by either zero-padding each digital word or by truncating each digital word (by removing least significant bits) by an appropriate amount in order to result in a digital word of the selected length. For example, if the digital words from the digital front-end processing block (not shown) after ADC 16a are 16 bits each, and a predetermined word length of 10 bits is selected in the mapper 22, then the mapper 22 will delete or delete with rounding the 6 least significant bits of each incoming digital word in order to reduce the word length of each word to 10 bits. As explained in detail later, the predetermined word lengths are preconfigured in advance.

Figure 3:
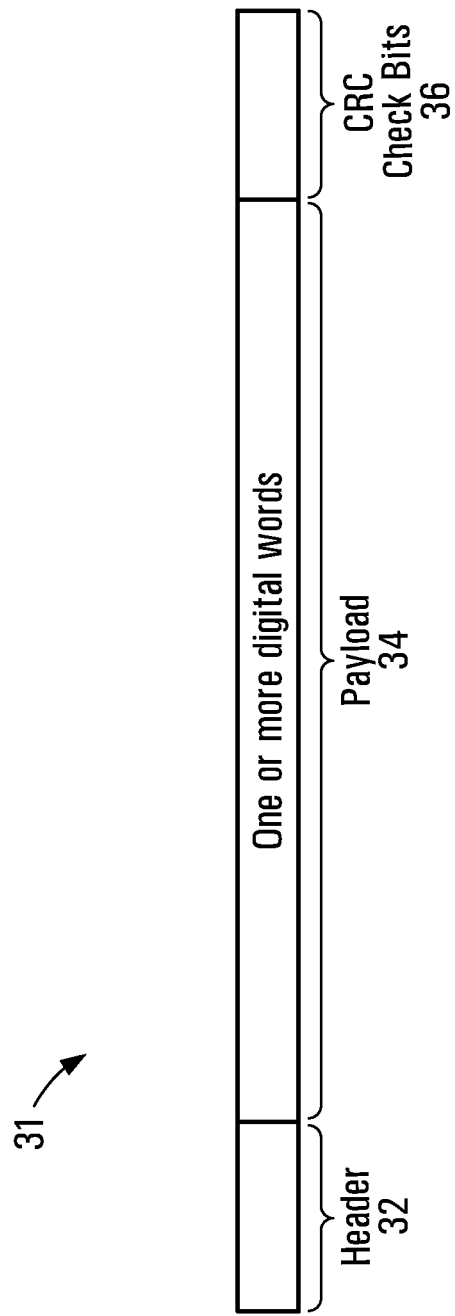
FIG. 3 illustrates an example of a digital frame for the digital interface.

The mapper 22 also maps the digital words to frames. An example of a frame 31 is illustrated in FIG. 3. The frame 31 comprises a payload 34 having one or more digital words therein. The frame 31 may also have a header 32. In some embodiments, the header 32 includes an index (not shown) that indicates the word length of the digital word(s) in the payload 34. The frame 31 may also include cyclic redundancy check (CRC) bits 36.

Returning to FIG. 2, the frames are transmitted through the physical channel 19 of the digital interface 8 to demapper 24, which extracts the digital words from the frames. The demapper 24 may also perform a CRC check if CRC check bits are present in the frame. Since different frames may carry digital words of different predetermined word lengths, the demapper 24 will also merge together all of the digital words (for example, by zero-padding digital words having a shorter length), so that all of the digital words have the same word length for subsequent processing.

The digital words then undergo digital processing 18a, which may include, for example, demodulation, decoding, filtering, and any other processing specific to the particular type of signal being received.

On the transmit path, the information to be transmitted undergoes digital processing 18b, which may include, for example, filtering, encoding, modulation, and any other processing specific to the particular type of signal being transmitted. The output of this digital processing 18b is digital words. For example, the digital words may be the in-phase (I) and quadrature-phase (Q) components of the modulated signal to be transmitted over antenna(s) 14.

After the digital processing 18b, the digital words are sent to mapper 26, which performs an operation similar to mapper 22. This is, mapper 26 maps each of the digital words to a particular predetermined word length that is selected in the manner described later. In one embodiment, mapping each of the digital words to a selected predetermined word length can be achieved by either zero-padding each digital word or by truncating each digital word (by removing least significant bits) by an appropriate amount in order to result in a digital word of the selected length. For example, if the digital words after the digital processing 18b are 16 bits each, and a predetermined word length of 10 bits is selected in the mapper 26, then the mapper 26 will delete or delete with rounding the 6 least significant bits of each incoming digital word in order to reduce the word length of each word to 10 bits.

The mapper 26 also maps the digital words to frames in the same way as mapper 22.

The frames are transmitted through the physical channel 19 of the digital interface 8 to demapper 28, which performs an operation similar to demapper 24. That is, demapper 28 extracts the digital words from the frames. In some embodiments, the demapper 28 may also perform a CRC check (if CRC check bits are present in the frame). Since different frames may carry digital words of different word lengths, the demapper 28 will also merge together all of the digital words (for example, by zero-padding digital words having a shorter length), so that all of the digital words have the same word length for subsequent processing.

The digital words then undergo digital-to-analog conversion in digital-to-analog converter (DAC) 16b. The resulting analog signal undergoes appropriate analog processing (e.g. up-conversion, filtering, power amplification), and is then fed through switch/duplexer 20 and transmitted over antenna(s) 14.

Only one downlink receive path and only one uplink transmit path is shown in FIG. 2. The illustrated receive and transmit paths are only one example, and they are specific to a given antenna or antennas 14, and they are specific to a particular radio access technology (RAT) and/or channel. Other receive and transmit paths having components similar to that shown in FIG. 2 may be present, but have been omitted for the sake of clarity.

The first IC 4 further includes a signal quality determiner 30, which determines the quality of the signal received (in the downlink) and the quality of the signal transmitted (in the uplink). This is because different operating conditions correspond to different signal qualities. For example, considering the downlink (the received signal), if the mobile device 2 is at the edge of a cell, the quality of the signal received (e.g. the signal-to-noise ratio (SNR)) will be lower than if the mobile device 2 is close to the base station and in a direct line of sight to the base station. Considering the uplink (the signal transmitted), the required quality of the signal to be transmitted (e.g. the SNR of the transmitted signal) will depend upon factors such as the modulation scheme and the transmission power, which typically change during transmission based on feedback from the base station. For example, if the mobile device 2 is close to the base station and in a direct line of sight to the base station, the base station may instruct the mobile device 2 to transmit using a higher-order modulation scheme (e.g. 64-QAM), which typically means a higher required SNR of the transmit signal. These factors are therefore indicative of the quality of the signal.

The word length of the digital words transmitted through the digital interface 8 also affects the quality of the signal. If fewer bits are used to represent the digital words, then the overall quality of the signal is reduced. Using fewer bits to represent each digital word means that information is being discarded, which decreases the overall SNR of the signal. In other words, using fewer bits to represent each word effectively lowers the signal-to-quantization-noise ratio (SQNR), and the reduced SQNR will reduce the overall SNR of the signal. Therefore, it is desirable to use as large of a word length as possible when transferring the digital words through the digital interface 8. However, it is also desirable to use as small as a word length as possible when transferring the digital words through the digital interface 8, as an increased word length means increased power consumption and bandwidth. Thus, to balance these two objectives, it is desired to use a smaller digital word length where possible while still ensuring that the reduced signal quality of using smaller digital words is not a limiting factor in the overall quality of the signal. Restating this objective in terms of SNR, it is desired to use a smaller digital word length where possible while still ensuring that the reduced SQNR associated with using smaller digital words is not a limiting factor in the overall SNR of the signal. This same objective applies to both the receive path and the transmit path.

However, as explained above, the quality of the signal will vary with the operating conditions of the mobile device 2. This therefore means that it is also possible to vary the digital word length with the operating conditions of the mobile device 2. In particular, the lower the signal quality, the smaller the digital word length that can be used. This is explained in more detail below in relation to both the downlink receive path and the uplink transmit path.

(1) The downlink receive path (received signal quality): It is desirable to use a smaller word length to transfer the received digital words through the digital interface 8, but it is also desirable to ensure that the reduced SQNR from using a smaller word length is not a limiting factor in the overall SNR of the received signal. For example, in one implementation, the SQNR should be 16 dB higher than the SNR of the received signal so that the SQNR is not a limiting factor. However, the number of bits necessary in order to achieve this depends upon the received SNR. For example, if the SNR of the received signal is 30 dB, then the SQNR should be 30+16=46 dB, whereas if the SNR of the received signal is only 0 dB, then the SQNR need only be 0+16=16 dB. The higher the required SQNR, the larger the required word length. This means that during operation, if the SNR of the received signal reduces (for example, if the mobile device 2 is far away from the base station), then the SQNR need not be as high (since the SNR is not as high), and the digital word length can be reduced. On the other hand, if the SNR of the received signal increases (for example, if the mobile device 2 is close to the base station and has a direct line of path), then the SQNR needs to be higher (since the SNR is higher) so that it is not a limiting factor on the overall SNR. In this situation, the digital word length needs to be increased.

(2) The uplink transmit path (signal quality of the transmitted signal): It is desirable to use a smaller word length to transfer the digital words through the digital interface 8, but it is also desirable to ensure that the reduced SQNR from using a smaller word length is not a limiting factor in the overall SNR of the signal being transmitted on the antenna(s) 14. Determining the required SQNR in the transmission path can be determined different ways. In one embodiment, the required SQNR can be linked to the modulation scheme. For example, if 4-QAM (e.g. QPSK) is chosen, this means that the transmitted signal can be transmitted at a lower SNR, which means a lower SQNR is required, and hence a smaller word length. However, in some embodiments, the modulation scheme alone is not necessarily indicative of the SNR of the transmitted signal and hence the required SQNR, as the SNR of the transmitted signal may also depend upon the transmission power. For example, if the mobile device 2 is at the edge of the cell, a low-order modulation scheme may be used (implying a lower SNR of the transmitted signal), but the transmission power may be high and the potential in-band emission in the unoccupied frequency portion and out-of-band emission may be high. To help control those emissions, higher signal to emission noise level ratio is needed on digital words (implying a higher overall SNR of the transmitted signal). Therefore, in other embodiments, the required SQNR can be calculated for a given modulation scheme and transmission power as follows:

(i) The required out-band SNR of the transmitted signal at the mobile device 2 is computed from the emission requirement specified in the protocol governing the transmission, and from the transmission power determined at the mobile device 2. The transmission power is determined in accordance with the uplink power control specified in the protocol based on at least one of the device maximum transmit power capability, downlink path-loss, and other control parameters supplied by the base station. An implementation-specific margin can then be added to obtain the SQNR out-band component.

(ii) The required in-band emission SNR of the transmitted signal is computed from the in-band emission requirement specified in the protocol governing the transmission in the unoccupied frequency portion. An implementation-specific margin can then be added to obtain the SQNR in-band emission component.

(iii) The required in-band SNR of the transmitted signal in the occupied frequency portion is obtained based on the modulation scheme and the protocol governing the transmission. An implementation-specific margin can then be added to obtain the SQNR in-band component.

(iv) The required SQNR is then determined as the maximum of the SQNR out-band component, the SQNR in-band emission component, and the SQNR in-band component.

Returning back to FIG. 2, the signal quality determiner 30 outputs at least one parameter indicative of the quality of a signal.

For the receive path, the at least one parameter may include a value of the SNR of the received signal. There are many different ways for the signal quality determiner 30 to obtain the SNR of the received signal. For example, the SNR can be measured or computed directly using downlink pilots in the received signal. As another example, the block error rate (BLER) over a given period of time can be computed by observing how often a reception of a downlink transport block from the base station fails, and then averaging the number of errors over the given period of time. The downlink transport block is a group of information bearing bits supplied to the physical layer for transmission from the base station to the mobile device 2. For the mobile device 2, a failure of the reception of a downlink transport block can be determined by checking the CRC embedded in the transport block. This CRC is different from the CRC in the frame 31 of FIG. 3, as the former is included in the transport block transmitted over the air while the latter is embedded in a frame pertaining to the local digital interface 8. The BLER can then be mapped to a corresponding SNR via a look-up table, which is populated during testing or characterization. Other methods of calculating the SNR of the received signal that are known can be used. The signal quality determiner 30, however, does not necessarily have to output a value of the SNR of the received signal. Other parameter(s) may additionally or instead be used to indicate the quality of the signal received. Some example are as follows: a symbol or bit error rate, a measurement of noise present in the signal, an indication of the modulation scheme used to by the base station transmitting the signal, or location of the mobile device in relation to the base station.

For the transmit path, the at least one parameter indicative of the quality of a signal may indicate the quality of the transmitted signal. This at least one parameter may be the modulation scheme, the transmission power, both of these values, or a SNR or SQNR derived from one or both of these values, as described above. In other embodiments, the signal quality determiner 30 may output other parameter(s) used to indicate the quality of the transmitted signal. Some examples are as follows: an SNR or error rate received from the base station, or information relating to the location of the mobile device in relation to the base station.

The at least one parameter from the output of the signal quality determiner 30 relating to the quality of the signal during downlink reception is sent to mapper 22, and the at least one parameter from the output of the signal quality determiner 30 relating to the quality of the signal during uplink transmission is sent to mapper 26.

Figure 4:
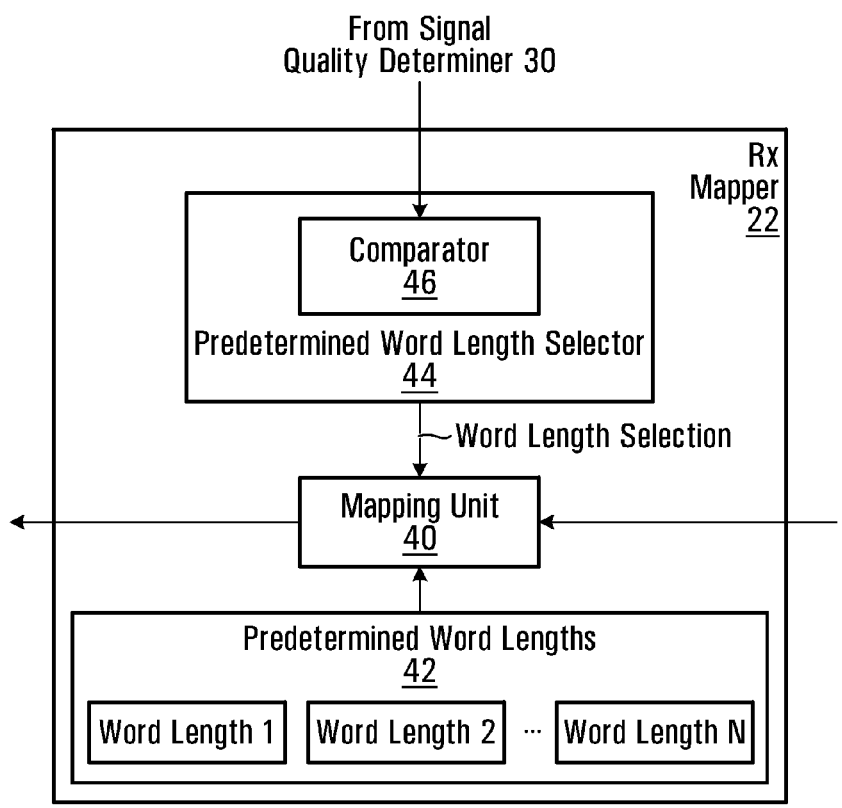
FIG. 4 is a block diagram of a mapper.

Mapper 22 is illustrated in more detail in FIG. 4. Mapper 22 includes a mapping unit 40 that performs the mapping discussed earlier. That is, mapping unit 40 maps each of the digital words to a selected predetermined word length, and it maps the digital words to frames. Also included in mapper 22 is memory having stored therein predetermined word lengths 42. In the illustrated embodiment, N predetermined word lengths are stored ("word length 1" to "word length N"). When a particular predetermined word length is selected, the mapper 22 maps each digital word to the predetermined word length specified by the selection. For example, predetermined word length 1 may specify a word length of 10 bits, and predetermined word length 2 may specify a word length of 8 bits. Therefore, when predetermined word length 1 is selected, each digital word is mapped to 10 bits (by either truncating or zero-padding the digital word, for example). When predetermined word length 2 is selected, each digital word is mapped to 8 bits (by either truncating or zero-padding the digital word, for example).

The values of "word length 1" to "word length N" are preconfigured prior to operation. In particular, each word length is preconfigured to have a word length value corresponding to a different expected window of quality of a signal.

As discussed earlier, the lower the quality of the signal (e.g. the lower the SNR of the signal), the smaller the word length that can be used. During operation, the predetermined word length selector 44 selects one of the predetermined word lengths ("word length 1", "word length 2", . . . "word length N") based upon the value from the signal quality determiner 30, by comparing the quality of the signal to the different windows of quality corresponding to each of the predetermined word lengths using comparator 46. Specifically, the quality of the signal is compared to at least one threshold (each threshold corresponding to a boundary of a window of quality). If the quality of the signal is above a particular threshold, this indicates that the quality of the signal is within a window of higher quality. If the quality of the signal is below that particular threshold, this indicates that the quality of the signal has fallen within a window of lower quality.

The number of predetermined word lengths that can be used (N) and the word length value of each word length is implementation specific. However, for the sake of completeness, an example is provided below.

Figure 5:
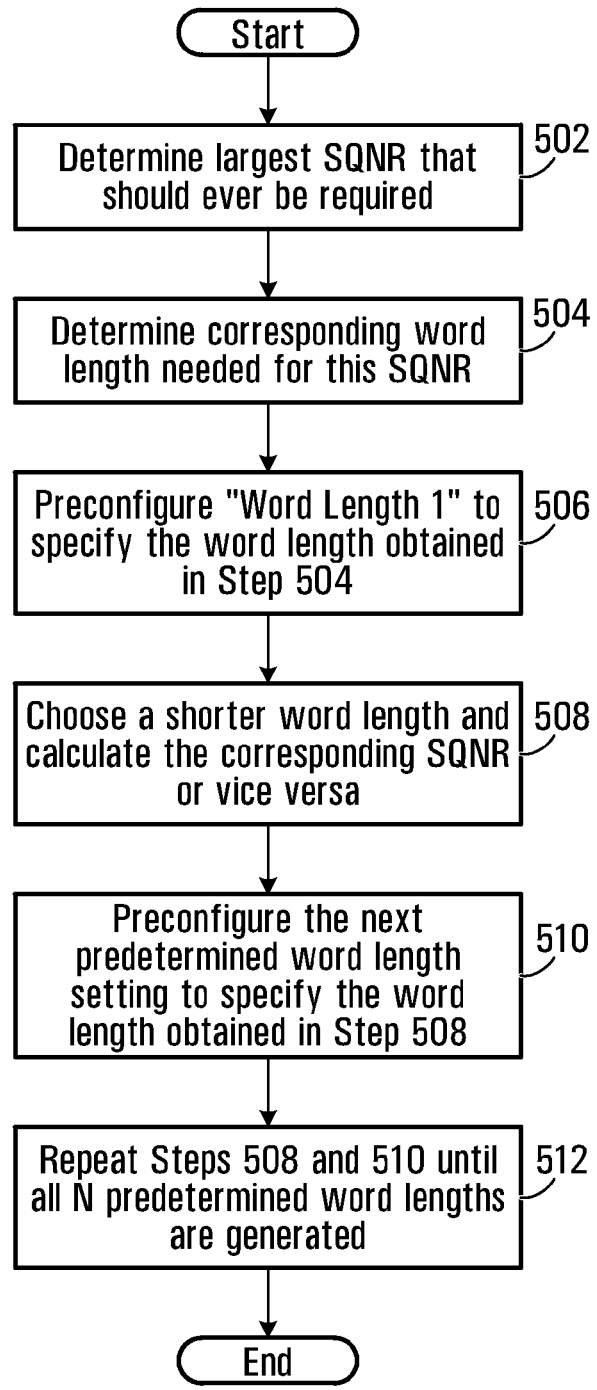
FIG. 5 is a flow diagram of a method of preconfiguring the settings for transferring digital words through the digital interface at different word lengths.

FIG. 5 discloses one example method of preconfiguring different word lengths.

In step 502, the largest SQNR that should ever be required during operation is determined prior to operation. This value is implementation specific and will depend upon system parameters and parameters such as the radio access technology.

Then, in step 504, the word length needed in order to achieve this best-case SQNR is computed.

Next, in step 506, "word length 1" of the predetermined word lengths 42 is set to specify this word length value.

Then, in step 508, a shorter word length is chosen and the corresponding SQNR is calculated, or vice versa. The word length chosen in step 508 is again implementation specific and should correspond to a lower SQNR that is sufficient when the SNR of the signal is reduced. Therefore, the word length chosen in step 508 will be lower than that in step 504.

In step 510, the next predetermined word length value (e.g. "word length 2") of the predetermined word lengths 42 is set to specify this word length.

In step 512, steps 508 and 510 are repeated until all N predetermined word lengths are generated, with each subsequently predetermined word length specifying a smaller word length, which corresponds to a range of required SQNR of lower quality (or correspondingly, a range of SNR of the signal that is lower).

By performing steps 502 to 512 of the method of FIG. 5, different windows indicative of the quality of the signal can be matched to different word lengths. These windows are bounded by thresholds. If the quality of the signal exceeds or drops below a particular threshold, it moves into a different window of quality.

In some embodiments, the method of FIG. 5 is performed offline prior to operation. In such embodiments, the steps of FIG. 5 may be performed by the designer implementing the digital interface 8. In other embodiments, the method of FIG. 5 can be performed by the first IC 4 prior to the operation of transmitting or receiving the signal.

Figure 6:
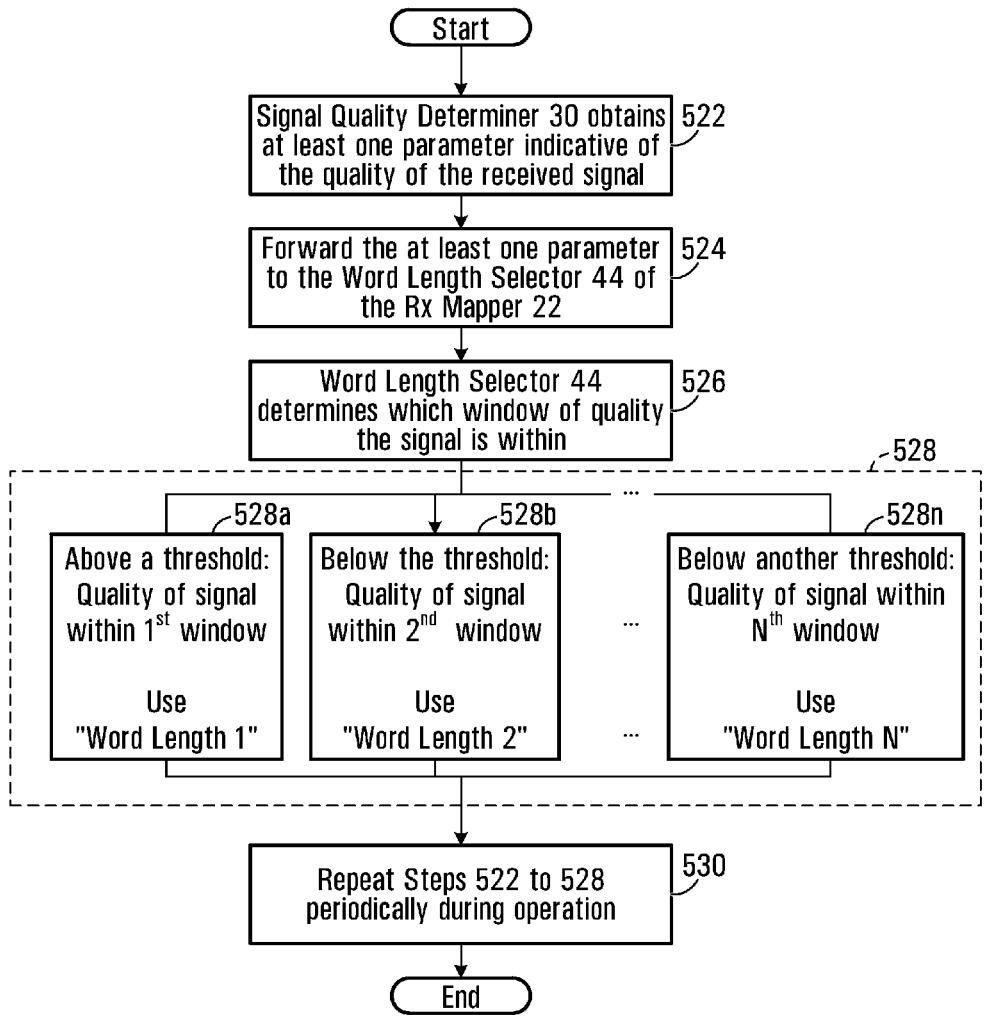
FIG. 6 is a flow diagram of a method of dynamically reducing the word length during operation of the digital interface.

During operation, the method of FIG. 6 is then performed by the mobile device 2.

In step 522, the signal quality determiner 30 obtains at least one parameter indicative of the quality of the received signal. For example, as discussed above, the at least one parameter can be the SNR of the received signal or the value of the required SQNR derived from the SNR of the received signal.

In step 524, the at least one parameter is forwarded to the predetermined word length selector 44 of the mapper 22.

In step 526, the word selector 44 reads the at least one parameter to determine which window of quality the signal is within. This is performed in compartor 46 by comparing the parameter to one or more thresholds (which bound the windows of quality) to determine which window of quality the signal is within.

In step 528, the word length selector 44 instructs the mapping unit 40 to use the predetermined word length corresponding to the quality of the signal as indicated by the at least one parameter.

For example, in step 528a, if the at least one parameter indicates that the quality of the signal is above a first threshold and therefore within a first window of quality (e.g. corresponding to an SNR of 30 dB or above, i.e., SQNR of 46 dB or above, as an example), then the word length selector 44 instructs the mapping unit 40 to use the first predetermined word length ("word length 1"), which has the largest word length value.

In step 528*b*, if the at least one parameter indicates that the quality of the signal is below the first threshold and within a second window of lower quality corresponding to "word length 2" (e.g. if the SQNR is less than 46 dB, but more than 34 dB, as an example), then the word length selector 44 instructs the mapping unit 40 to use "word length 2", which has a reduced word length.

In step 528*n*, if the at least one parameter indicates that the quality of the signal is below yet another threshold and therefore within the lowest window of quality (e.g. corresponding to an SQNR lower than 22 dB, as an example), then the word length selector 44 instructs the mapping unit 40 to use "word length N", which has the smallest word length value.

Next, in step 530, steps 522 to 528 are repeated periodically during operation. For example, the steps may be repeated once per predetermined time interval or whenever a change in the at least one parameter indicative of the quality of the received signal is received.

Thus, by performing the method of FIG. 6, the word length is dynamically reduced when possible (i.e. when the quality of the signal is reduced). Dynamically reducing the word length can be done very efficiently during operation by simply switching between the predetermined word lengths. As one example, the mapping unit 40 can simply indicate which predetermined word length is being used in the header of each frame, so that the demapper 24 will know the length of each word in each frame. This allows switching between word lengths on the fly without an interruption in operation.

It will be appreciated that in alternative embodiments, the comparison described above in step 526 and 528 could instead be made outside the mapper 22, such as in the signal quality determiner 30 itself or somewhere else in the first IC 4. In such a case, only an indication of which predetermined word length to select would need to be sent through the interface 8 to the mapper 22. The predetermined word length selector 44 would then simply ensure that the correct predetermined word length is selected.

The mapper 26 in the uplink transmit path operates in the same way as mapper 22, and therefore will not be described in detail. The only notable difference is that the at least one parameter indicative of the quality of the transmit signal will in general be different from that of the received signal. For example, as discussed above, the at least one parameter indicative of the quality of the transmit signal may be, for example, an indication of the modulation scheme, the transmission power, both of these values, or an SNR or SQNR derived from one or both of these values.

In the illustrated embodiment, the dynamic word length reduction can be implemented independently in each channel (downlink and uplink), and is specific to the channel. Other channels (which may correspond to other antennas and/or RATs) can also independently implement their own dynamic word length reduction using the same method described above.

The embodiments described above provide a system and method for transmitting data through a digital interface in which digital words of the data are dynamically reduced. In particular, the word length of the digital words is dynamically reduced based on the quality of a signal. The signal may be received from the wireless channel, with the digital words being extracted from the signal. These extracted digital words are then used to obtain the at least one parameter indicative of the quality of the signal. The signal may be for transmitting the digital words over the wireless channel. In each case, the signal comprises the digital words, whether the signal is in digital form (just after modulation or just before demodulation) or in analog form (during transmission over the channel). Additionally, it should be noted that the word length is typically bits, but not limited to bits (e.g. if the digital words are represented using another scheme, such as, for example, a base-3 or a base-10 numeral system).

Moreover, it will be appreciated that the functionality described above and herein, such as that described in relation to signal quality determiner 30 and predetermined word length selector 44, may be implemented in one or more of hardware, firmware, or software in combination with a processor to run the software. For example, the signal quality determiners, the predetermined word length selectors, and the mapping units described herein may each be a module or application comprising instructions stored on hardware, firmware, or any other computer-readable medium that, when executed by a processing unit, perform the described functions.

A few specific example implementations will now be described in detail below in the specific context of a DigRF interface (e.g. the MIPI Alliance Specification for DigRF v4). However, as is clear from the above, the methods described below are not limited to implementation in a DigRF interface.

Figure 7:
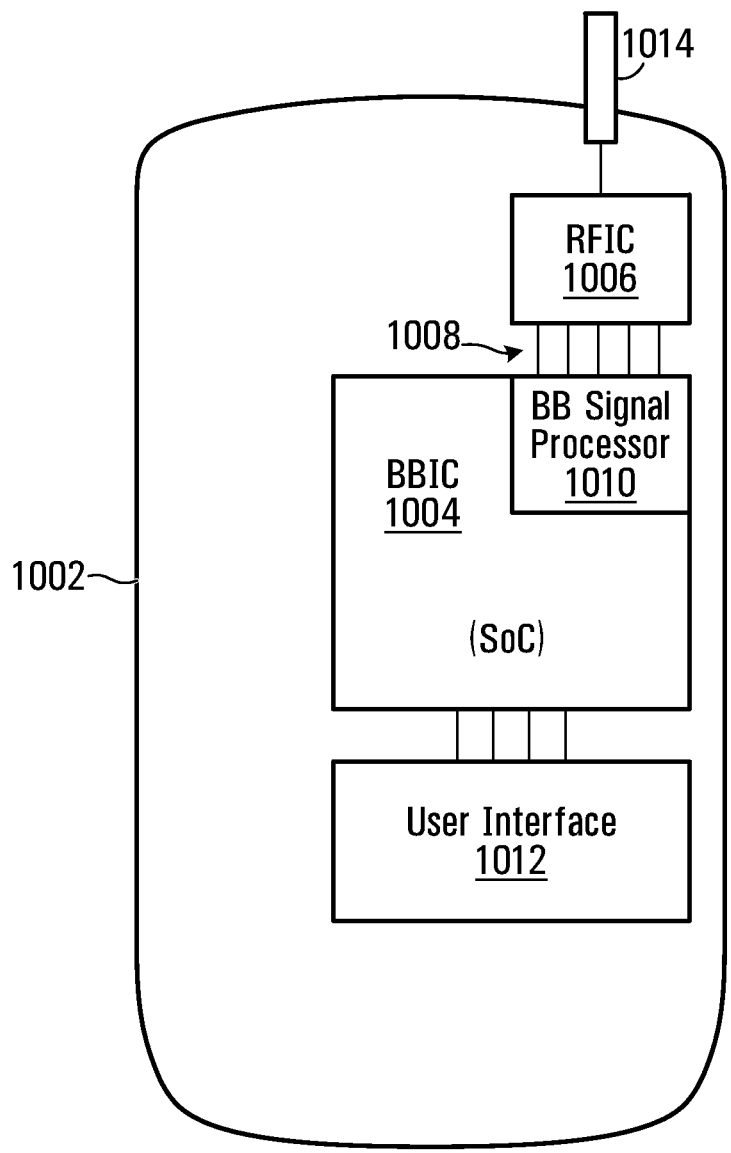
FIG. 7 is a block diagram of a mobile device.

Turning therefore to FIG. 7, another example of a mobile device 1002 is illustrated. The mobile device 1002 includes a radio frequency integrated circuit (RFIC) 1006 connected to one or more antennas 1014. The RFIC 1006 is also connected to a baseband integrated circuit (BBIC) 1004 via a digital interface 1008.

The BBIC 1004 is a system on chip (SoC) that includes the core processing functions (not shown) of the mobile device 1002. A baseband (BB) signal processor 1010 on the BBIC 1004 interfaces with the RFIC 1006 via the digital interface 1008. The BBIC 1004 also connects to other ICs, such as an IC for a user interface 1012.

It will be appreciated that many details of the mobile device 1002 are omitted for the sake of clarity.

Figure 8:
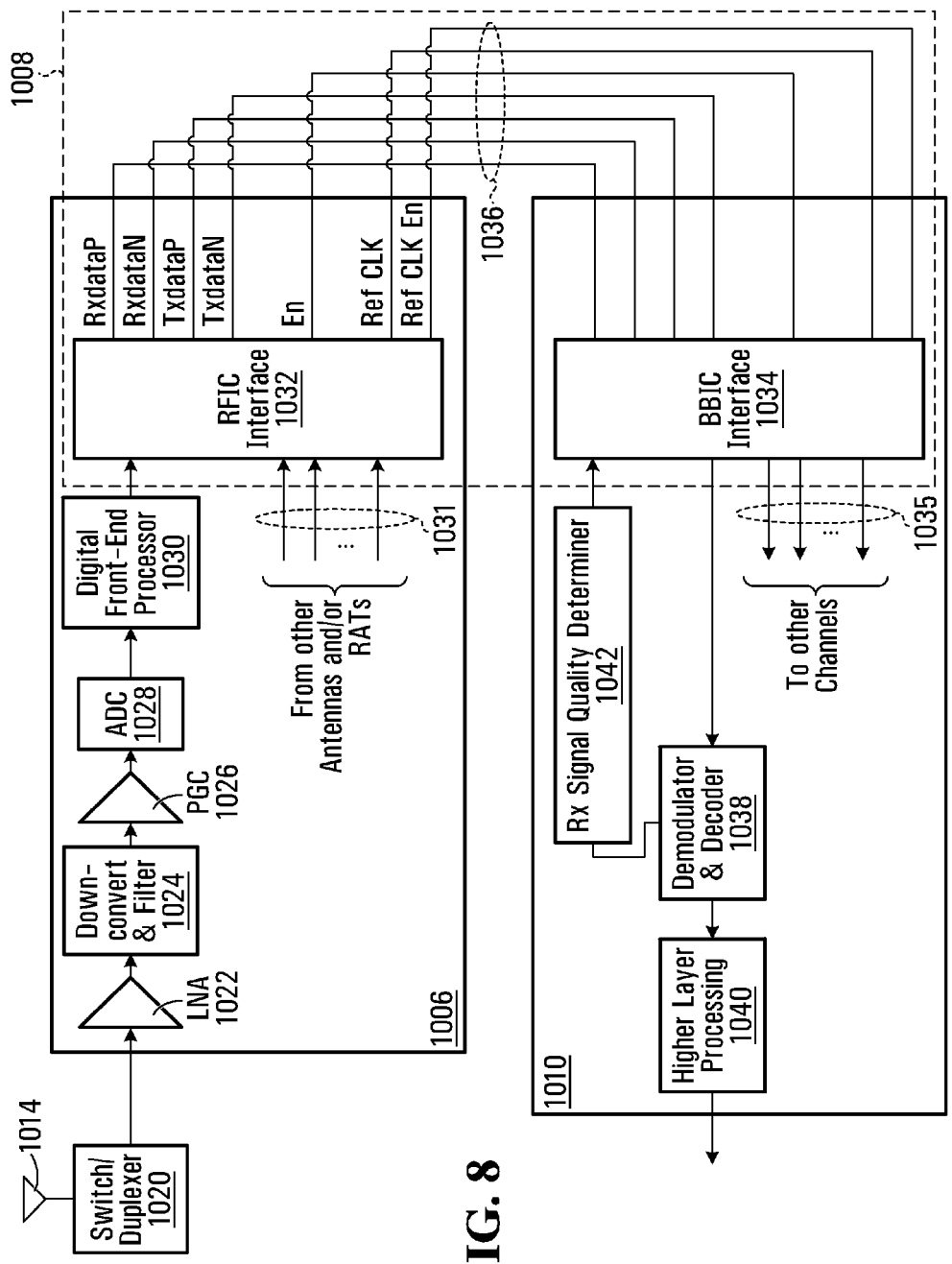
FIGS. 8 and 9 illustrate the digital interface of the mobile device in more detail during data reception (the downlink receive path)
Figure 9:
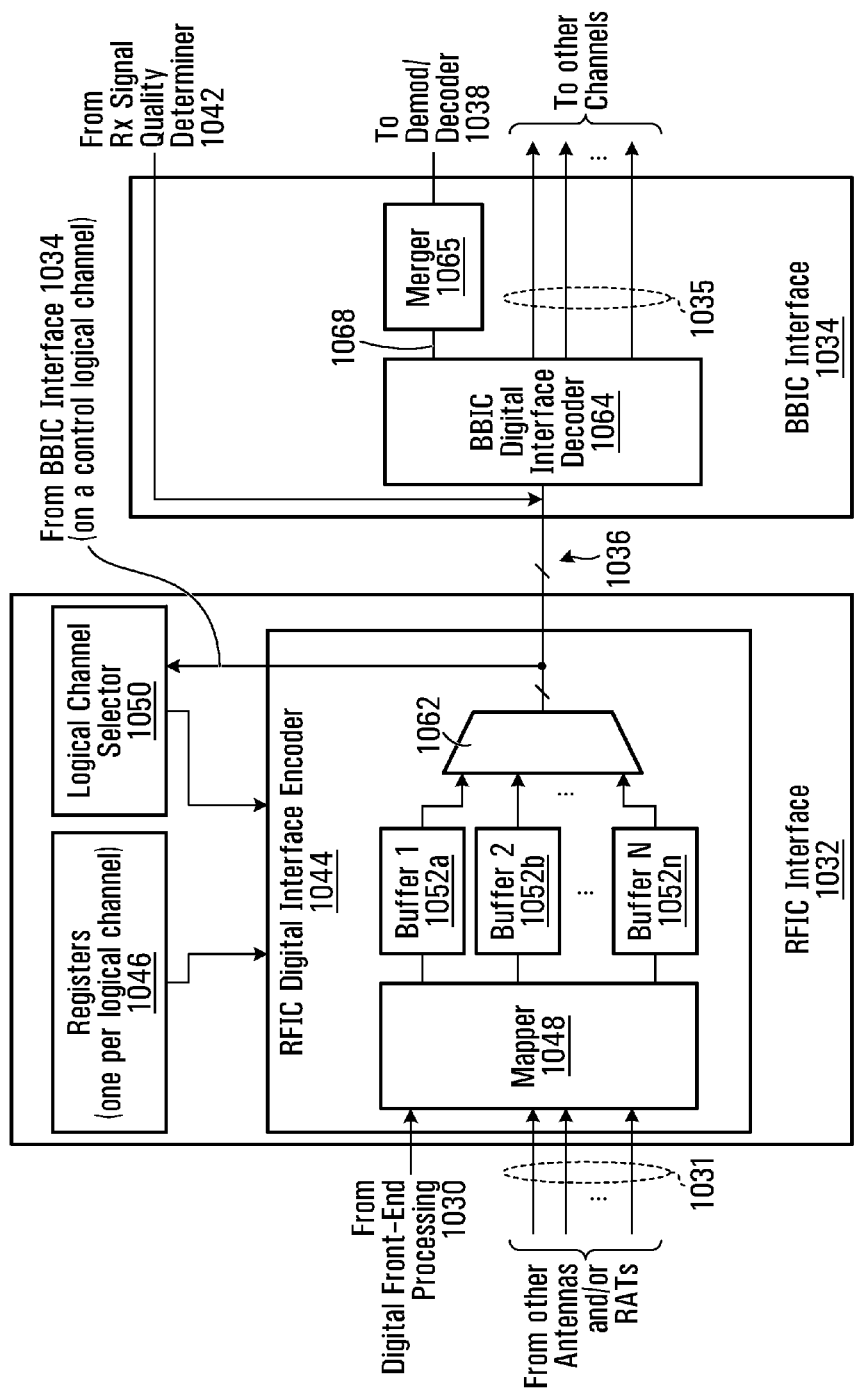
Figure 11:
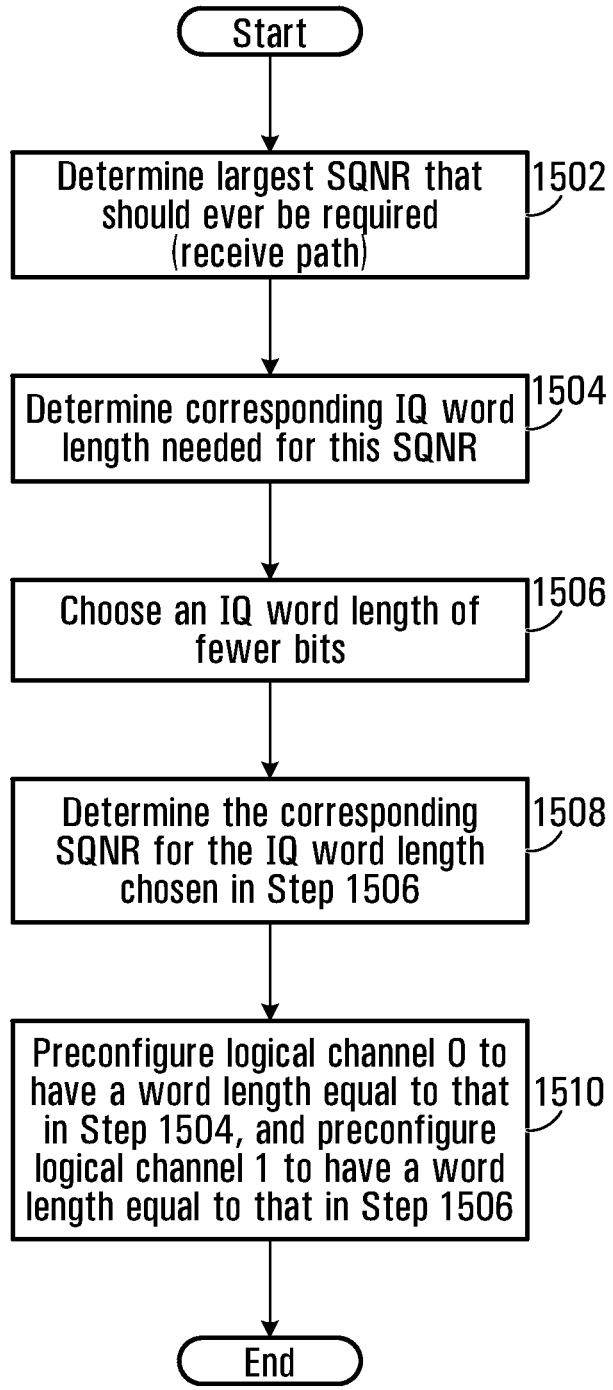
FIG. 11 is a flow diagram of a method of preconfiguring logical channels for data reception through the digital interface.
Figure 12:
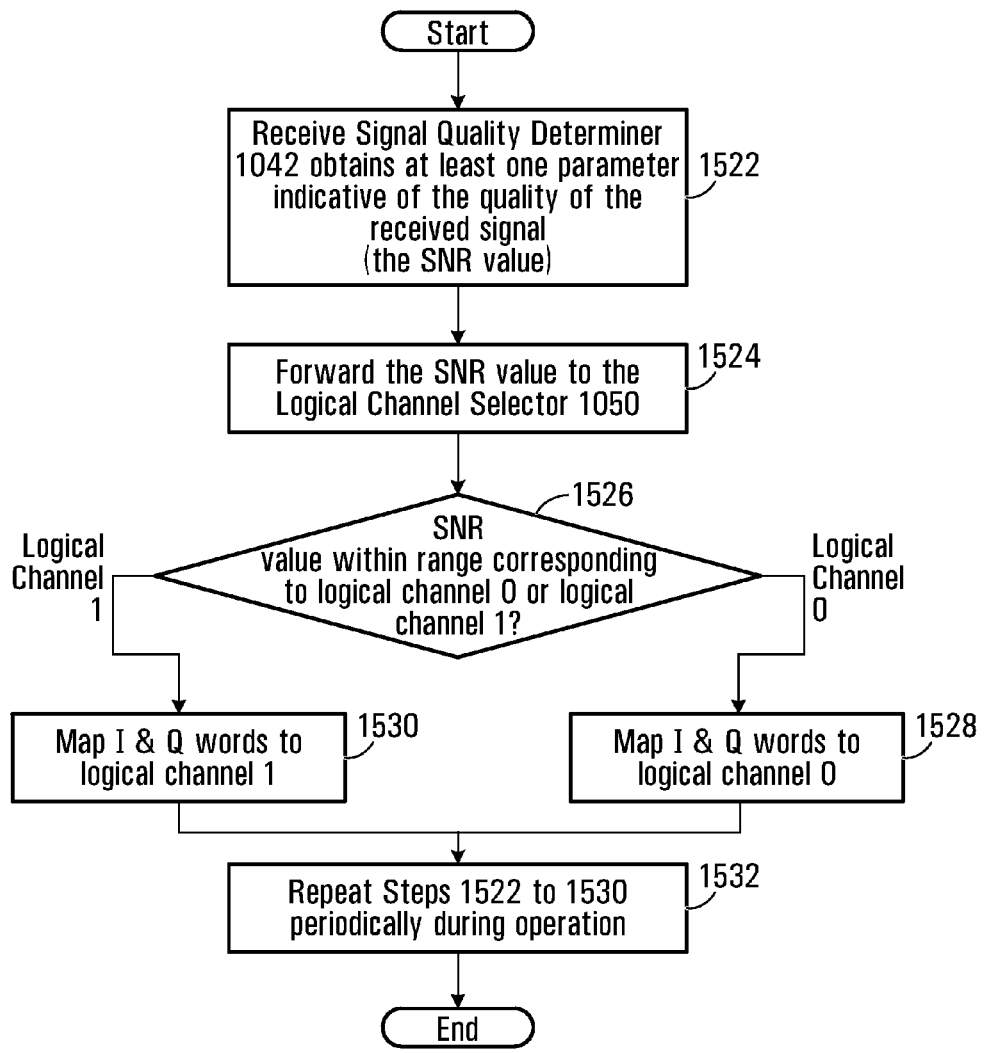
FIG. 12 is a flow diagram of a method of dynamically reducing the word length while receiving a signal through of the digital interface.
Figure 13:
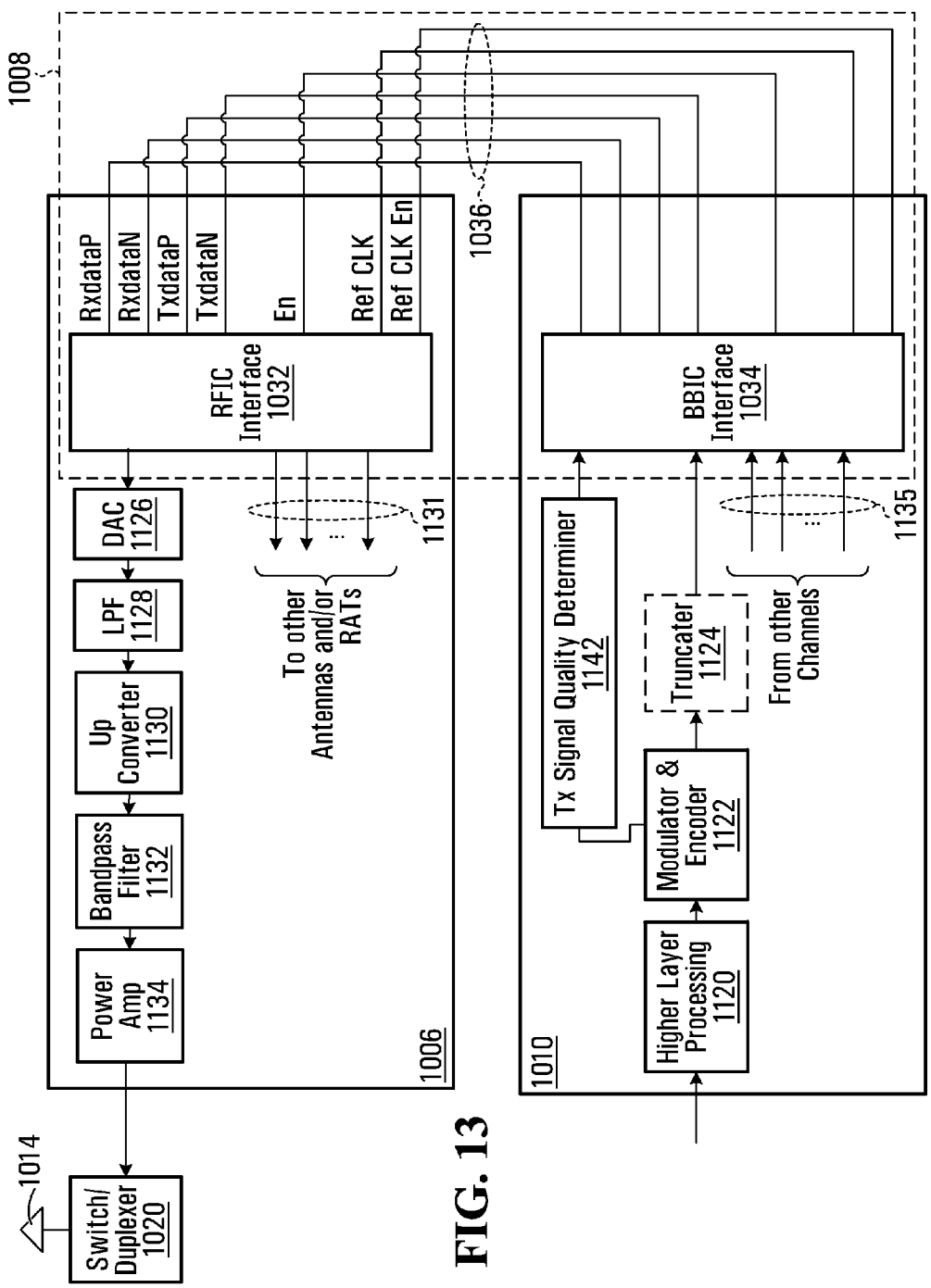
FIGS. 13 and 14 illustrate the digital interface of the mobile device in more detail during data transmission (the uplink transmission path)
Figure 14:
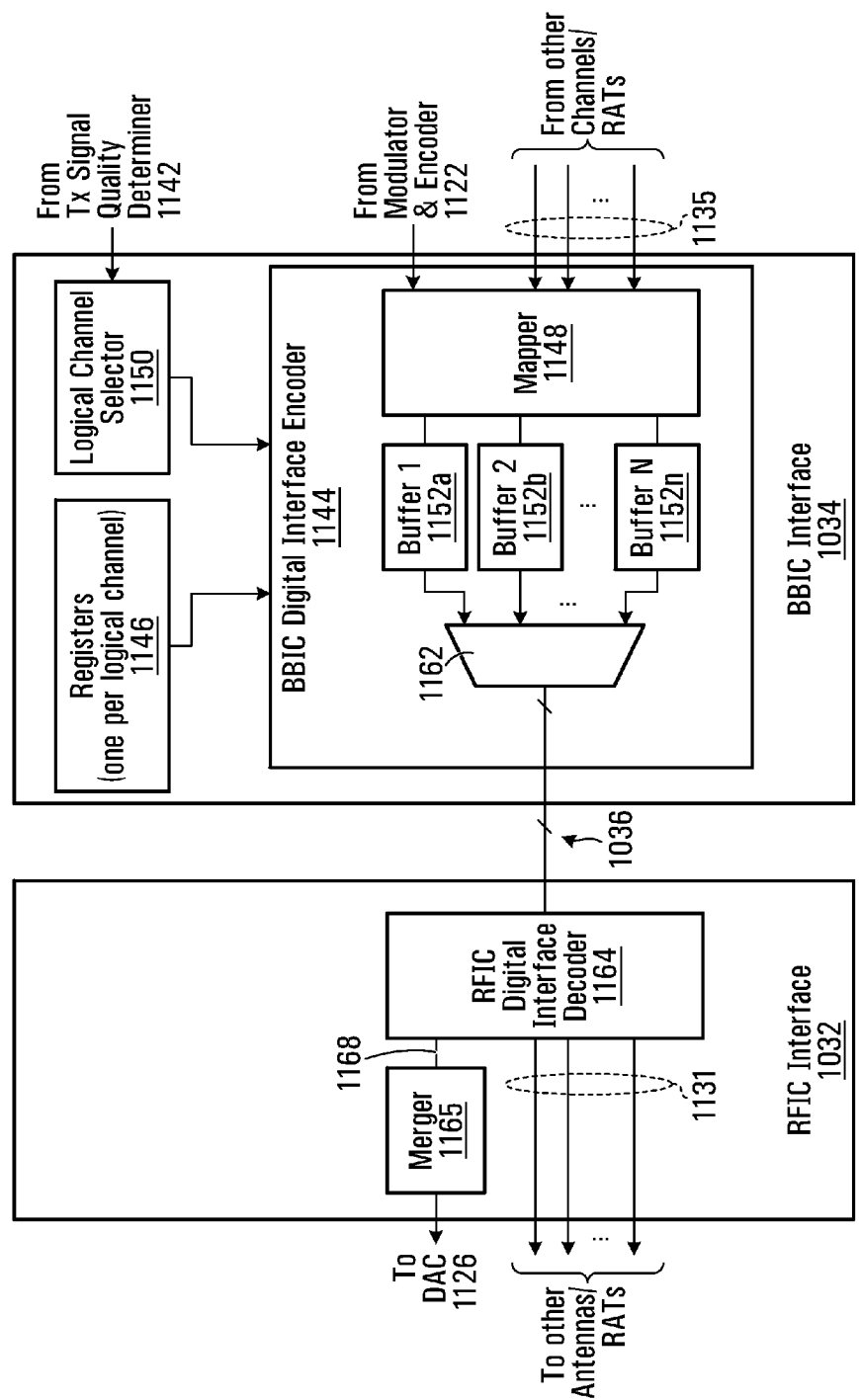

An example of the RFIC 1006 and the BB signal processor 1010 of the mobile device 1002 is shown in FIGS. 8 to 16. FIGS. 8 and 9 illustrate the downlink (receive path), and FIGS. 13 and 14 illustrate the uplink (transmit path). It will be appreciated that other components of the RFIC 1006 and BB processor 1010 may also be present, but have been omitted from these figures for the sake of clarity.

Turning therefore to FIG. 8, the downlink (receive path) is illustrated. The antenna 1014 is connected to the RFIC 1006 via a switch/duplexer 1020. The analog signal received on the antenna 1014 undergoes analog signal processing in the RFIC 1006, including low noise amplification via a low noise amplifier (LNA) 1022, down conversion and filtering 1024, and signal amplification via a programmable gain control (PGC) 1026. The analog signal is then converted to a digital signal via an analog-to-digital converter (ADC) 1028. The digital samples or words from the ADC 1028 are the in-phase (I) and quadrature-phase (Q) components of the received signal, which are representative of the received constellation symbols that are to be demodulated and decoded in order to allow the mobile device 1002 to make a decision as to which information bits were transmitted. The number of digital bits used to represent each I and Q component is typically fixed by the ADC 1028 and is implementation specific. For example, each I and Q component or word may be represented by 10 bits. The number of bits used to represent the I and Q words is called the IQ word length.

After the ADC 1028, the digital I and Q words undergo digital front-end processing 1030 to optimize the power level, and then the words are sent to the RFIC interface 1032.

Only one downlink receive path is shown in FIG. 8. The illustrated receive path is only one example, and it is specific to a given antenna or antennas 1014, and it is specific to a particular radio access technology (RAT). Other receive paths on the RFIC 1006 (e.g. specific to other antennas not shown and/or other RATs) are also fed into the RFIC interface 1032, as shown at 1031.

The digital interface 1008 between the RFIC 1006 and the BBIC signal processor 1010 includes both the RFIC interface 1032 and the BBIC interface 1034, which are connected via a physical channel 1036. The digital signals are transmitted through the physical pins of the RFIC 1006 and the BBIC 1004 and over the physical channel 1036. The digital signals transmitted over the physical channel 1036 via the physical pins include:

(i) the receive data (on the downlink), which are transmitted via pins Rxdata_P and Rxdata_N (differential transmission);
(ii) the transmit data (on the uplink), which are transmitted via pins Txdata_P and Txdata_N (differential transmission);
(iii) an enable signal, which is transmitted via the "En" pin, and which allows the BBIC interface 1034 to enable the RFIC interface 1032; and
(iv) the reference clock and reference clock enable, which are transmitted via pins "RefClk" and "RefClk En" respectively, and which allow the BBIC interface 1034 to send to the RFIC interface 1032 a reference clock for synchronization and a signal enabling the reference clock.

In the implementation described with reference to FIGS. 8 and 9, the BBIC interface 1034 is the master, and the RFIC interface 1032 is the slave.

The BBIC interface 1034 and the RFIC interface 1032 will be explained in more detail later with reference to FIG. 9.

Once the digital I and Q words are transferred through the digital interface 1008, they are forwarded to a demodulator and decoder 1038 in the BBIC 1004, which performs demodulation and decoding in order to make a decision as to which information bits were transmitted. The information bits then undergo higher-layer processing 1040, such as, for example, medium access control (MAC) processing and/or radio resource control layer processing. The digital I and Q words from the other antennas and/or RATs 1031 are also sent over the digital interface 1008 and are forwarded to their associated other channels 1035.

It will be appreciated that the RFIC 1006 and the BBIC signal processor 1010 may include other receive signal processing, which has been omitted for the sake of clarity. Some of this additional signal processing may depend upon the particular type of signal being received. For example, if the received signal is an orthogonal frequency divisional multiplexing (OFDM) signal, there may be specific processing relating to resource element demapping and fast fourier transformation (FFT).

The BBIC processor 1010 further includes a receive signal quality determiner 1042, which determines the quality of the received signal. In one implementation, the receive signal quality determiner 1042 calculates the signal-to-noise ratio (SNR) of the signal. One way to achieve this is to measure the SNR directly using downlink pilots in the signal. Another way to achieve this is to calculate the block error rate (BLER) over a given period of time by observing how often a reception of a downlink transport block from the base station fails, and then averaging the number of errors over the given period of time. The BLER can then be mapped to a corresponding SNR via a look-up table, which is populated during testing or characterization. Other methods of calculating the SNR of the received signal that are known can be used.

It should be noted that the receive signal quality determiner 1042 does not necessarily have to output a measure of the SNR of the received signal. Other parameter(s) may additionally or instead be used to indicate the quality of the signal, such as a symbol or bit error rate, a measurement of noise present in the signal, or location of the mobile device in relation to the base station.

As will be discussed in more detail later, the output of the receive signal quality determiner 1042 is forwarded to the interface 1008, which uses the information to determine whether the word length of the I and Q words can be reduced during transmission through the interface 1008.

The RFIC interface 1032 and the BBIC interface 1034 of the interface 1008 are shown in more detail in FIG. 9. After digital front-end processing 1030, the I and Q digital words are forwarded to an RFIC digital interface encoder 1044. The RFIC digital interface encoder 1044 interfaces with a set of registers 1046, which define a plurality of logical channels (e.g. 8 logical channels). For example, there may be one register per logical channel. For each logical channel, there is a defined number of bits used to represent each I and Q word of the received digital signal, i.e., the IQ word length. This parameter can be programmed in the register itself, and it is predetermined. For example, logical channel 0 may be predetermined to have an IQ word length of 10 bits, logical channel 1 may be predetermined to have an IQ word length of 8 bits, logical channel 2 may be predetermined to have an IQ word length of 16 bits, and so on.

The I and Q words from digital front-end processing 1030 map to either logical channel 0 or logical channel 1, as selected by logical channel selector 1050. The I and Q words from the other antennas and/or RATs 1031 are mapped to the other logical channels. Mapping the I and Q words from digital front-end processing 1030 to a specific logical channel comprises either zero-padding or (more likely) truncating the I and Q words in order to represent them using the predetermined word length associated with the logical channel.

As an example, assume logical channel 0 is preconfigured to define an IQ word length of 10 bits, and logical channel 1 is preconfigured to define an IQ word length of 8 bits. Thus, if logical channel 0 is selected during operation, the mapper 1048 maps each incoming digital I word and digital Q word from digital front-end processing 1030 to a 10 bit digital word. This is achieved by either truncating or zero-padding the incoming I and Q words. For example, if the digital front-end processing 1030 represents each I word using 16 bits and each Q word using 16 bits, then if logical channel 0 is selected, the mapper 1048 will discard the 6 least significant bits of each incoming I and Q word in order to reduce the word length from 16 bits to 10 bits. If the digital front-end processing 1030 happened to represent each I and Q component using 8 bits, then if logical channel 0 were selected the mapper 1048 would have to add two zeros to each I and Q word in order to bring the word length up to 10 bits by zero-padding. Note that it is unlikely that the mapper 1048 will need to zero-pad. Typically, the mapper 1048 will need to truncate the incoming I and Q words. This is because the digital front-end processing 1030 typically is designed to have more bits so as to be able to handle the received signal over a wide range of quality requirements.

Figure 10:
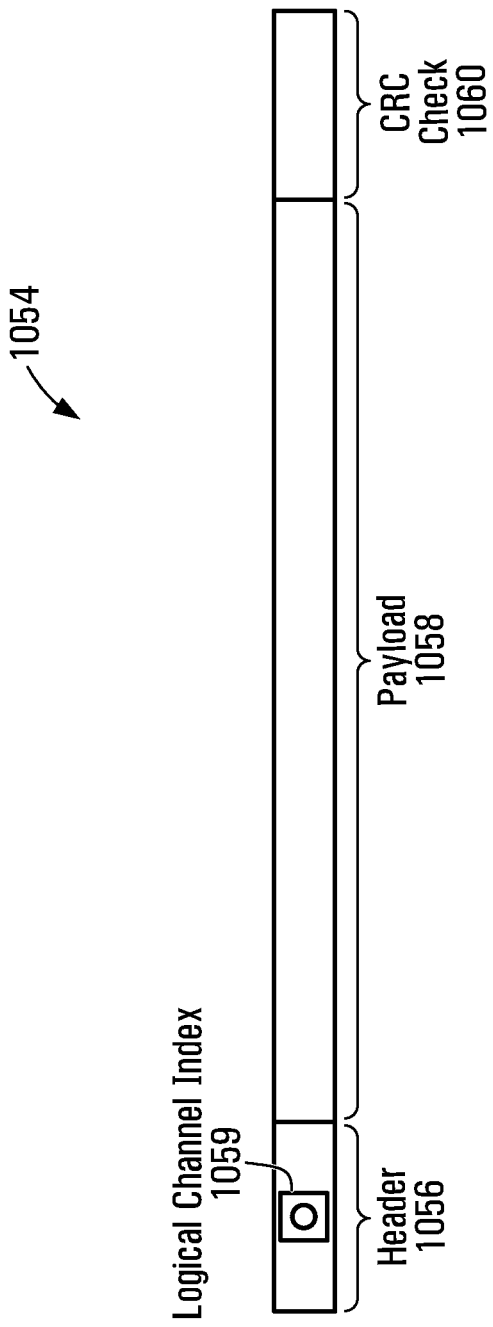
FIG. 10 illustrates another example of a digital frame for the digital interface.

Each IQ pair is also mapped by the mapper 1048 to a payload 1058 of a frame 1054, which is shown in FIG. 10. The frame 1054 also includes a header 1056 and CRC check bits 1060, which are generated by the mapper 1048. The header 1056 specifies the logical channel of the I and Q words in the payload 1058 via a logical channel index 1059.

Returning to FIG. 9, each frame from the mapper 1048 is stored in one of the buffers 1052a-1052n. There is one buffer per downlink receive path. Each frame corresponding to the I and Q words from digital front-end processing 1030 are stored in the buffer 1052a. Each one of the frames stored in buffer 1052a will have a header with a logical channel index of either 0 or 1, specifying whether the logical channel of the I and Q components of that frame is either logical channel 0 or logical channel 1. The data from the other antennas and/or RATs 1031 are mapped to their respective logical channels and stored in buffers 1052b-1052n.

The data stored in each of the buffers 1052a-1052n is then transmitted serially in bursts over the physical channel 1036 (via the RxdataP and RxdataN pins). The multiplexer 1062 multiplexes the data from the buffers 1052-1052n onto the physical channel 1036. As will be appreciated, the transmission rate of the data over the physical channel 1036 must on average be the same or faster than the sum of the individual rates at which frames are written to each of buffers 1052a-1052n in order to avoid continual buffer overflow.

The BBIC Interface 1034 includes a BBIC digital interface decoder 1064, which reads the header of each frame received over the physical channel 1036 and maps the payload of the frame to the appropriate channel based on the logical channel specified in the header. For example, when frame 1054 is received by the BBIC digital interface decoder 1064, the payload of the frame is mapped to channel 1068, which goes to demodulator and decoder 1038. This is because this illustrated receive path is associated with logical channels 0 and 1. When other logical channel indices are read in the headers of other frames, these other frame are mapped to the receive paths of the other channels 1035.

Channel 1068 includes a merger 1065, which merges together I and Q words of different word lengths on channel 1068 so that the rest of the downlink in the BBIC signal processor 1010 (e.g. the demodulator and decoder 1038) are working with a consistent IQ word length. One way to achieve this is to simply concatenate all of the I and Q words received on either logical channel 0 or logical channel 1, and zero-pad the I and Q words having fewer bits. For example, assuming logical channel 0 defines an IQ word length of 10 bits and logical channel 1 defines an IQ word length of 8 bits, then the I and Q words on logical channel 1 would be zero-padded (by adding two zeros) in order to bring the IQ word length up to 10 bits. In some embodiments, the merger 1065 will also adjust for any implementation-specific delay variation of the digital words received from the decoder 1064.

Merging the different word lengths as described can also assist in error recovery. Specifically, by merging the different word lengths so that each word length is constant, the expected number of samples (or words) between logical channel switching boundaries can be determined. It is then possible to check if a burst of samples with a number of samples matching an expected number has been successfully received from one logical channel before the arrival of samples from the other logical channel, and if not, then padding samples with value 0 if the number of samples does not match the expected number. For this to happen, the switching point between logical channel 0 and logical channel 1 should be placed at time boundaries of an integer multiple of a specific time interval, and as such the number of samples within each time interval can be known and used for error checking and error recovery.

Preconfiguration of the logical channels and operation of the interface 1008 while receiving downlink data will now be explained.

The logical channels are first preconfigured to each have a particular IQ word length in the manner described below.

Prior to operation, it is determined how many bits are necessary to represent each of the digital I and Q words in the digital interface 1008. As discussed earlier, the fewer the number of bits used to represent each word, the less power and bandwidth consumed transferring the words across the interface 1008. Therefore, it is desirable to use as few bits as possible to represent each received I and Q word. However, the fewer the bits used, the greater the impact on the overall signal-to-noise ratio (SNR) of the received signal. That is, using fewer bits to represent each received I and Q word means that information is being discarded, which decreases the overall SNR of the received signal. In other words, using fewer bits to represent each word effectively lowers the signal-to-quantization-noise ratio (SQNR), and the reduced SQNR will reduce the overall SNR of the received signal and therefore impact the demodulation of data received from the digital interface 1008 and ultimately will impact the demodulation of the signal received from the base station, which could increase the block error rate. Therefore, it is also desirable to use as many bits as possible to represent each received I and Q word.

Thus, the desired objective is to represent each of the I and Q words using fewer bits where possible, while still striving to ensure that the SQNR is not a limiting factor in the overall SNR of the received signal. For example, in one implementation, the SQNR should be 16 dB higher than the SNR of the received signal so that the SQNR is not a limiting factor. However, the number of bits necessary in order to achieve this depends upon the received SNR. For example, if the SNR of the received signal is 30 dB, then the SQNR should be 30+16=46 dB, whereas if the SNR of the received signal is only 0 dB, then the SQNR need only be 0+16=16 dB.

The higher the required SQNR, the greater the number of bits needed to represent each received I and Q words. This means that during operation, if the SNR of the received signal reduces (for example, if the mobile device 1002 is far away from the base station), then the SQNR need not be as high (since the SNR is not as high), and fewer bits can be used to represent the I and Q words. On the other hand, if the SNR of the received signal increases (for example, if the mobile device is close to the base station and has a direct line of path), then the SQNR needs to be higher (since the SNR is higher) so that it is not a limiting factor on the overall SNR. In this situation, more bits are needed in order to represent each received I and Q word.

With this goal in mind, and turning to FIG. 11, logical channels 0 and 1 are preconfigured as follows.

In step 1502, the largest SQNR that should ever be required during operation is determined prior to operation. This value is implementation specific and typically depends upon the radio access technology and the modulation scheme. For example, for Long Term Evolution (LTE) 64-QAM, it is typically the case that the overall SNR of the received signal need not be more than 30 dB. The SQNR should be at least 16 dB higher than this, which is 46 dB.

In step 1504, the IQ word length needed in order to achieve this best-case SQNR is computed. Such a computation is known in the art. For example, the following formula may be used:

$$SQNR(dB) = 6.02(N_{quan} - 1) + 10.8 + P_{signal} + 10\log_{10}\frac{f_{samp}}{B_{signal}} \quad (1)$$

where $P_{signal}$ is the signal power level, average of $$\frac{1}{2}(x_I^2(n) + x_Q^2(n)),$$

with respect to a full-scale (Fs) digital power defined as $2^{2 \cdot (N_{quan}-1)}$. Here, $x_I(n)$ and $x_Q(n)$ are the n-th I word and Q word, respectively. The units of $P_{signal}$ are in dBFs. In Equation 1, $B_{signal}$ is the occupied bandwidth of the signal, and $f_{samp}$ is the sampling frequency.

$$10\log_{10}\frac{f_{samp}}{B_{signal}}$$

represents an oversampling gain. The equation can be solved for the number of quantization bits (i.e., word length) required, $N_{quan}$.

For the situation discussed above, let it be assumed that the IQ word length is 10 bits, the signal power level $P_{signal}$ is set to −21 dBFs to leave enough power headroom to avoid a potential saturation (since saturation may severely distort the digital signal), and there is an oversampling gain of 2 dB. The resulting SQNR is:

SQNR=6.02*9+10.8−21+2=46 dB.

This means that if the SNR of the received signal is 30 dB, it is sufficient to use an IQ word length of 10 bits, as the corresponding SQNR is 16 dB higher than the SNR. Using a longer IQ word length is not necessary, as it will not have any noticeable impact on an overall required SNR of 30 dB.

Next, in step 1506, an IQ word length of fewer bits is chosen, and in step 1508, the corresponding SQNR is calculated. The IQ word length chosen in step 1506 is again implementation specific and should correspond to a lower SQNR that is sufficient when the SNR of the received signal is reduced (for example, when the mobile device 1002 is near the edge of a cell, searching for a cell to camp, or intends to receive data modulated with a low-order modulation scheme, such as QPSK).

As an example, assume an IQ word length of 8 bits is chosen in step 1506, which, for example, corresponds to an SQNR of 34 dB (calculated in step 1508 using known methods, such as using the equation shown above with $N_{quan}$=8, $P_{signal}$=−21 dBFs and an oversampling gain of 2 dB).

In the example situation discussed above, the SQNR should be at least 16 dB above the SNR of the received signal so that it is not a limiting factor on the overall SNR. Therefore, an SQNR of 34 dB provided by an IQ word length of 8 bits is sufficient if the SNR of the received signal is 18 dB or lower, since 34−16=18.

Thus, if the SNR of the received signal is within the window of higher than 18 dB, more than 8 bits should be used to represent the IQ word length, whereas if the SNR of the received signal is within the window of 18 dB or lower, then 8 bits is sufficient in order to represent the IQ word length.

By performing steps 1502 to 1508 of the method of FIG. 11, different windows of received SNRs can be matched to different IQ word lengths. In the example described above, two IQ word lengths of 10 and 8 bits respectively are determined, and so there are two different windows of received SNRs matched to word lengths. Specifically, an IQ word length of 8 bits can be used if the SNR of the received signal is 18 dB or lower. Otherwise, an IQ word length of 10 bits must be used is the received signal is greater than 18 dB.

It will be appreciated that other IQ word lengths and corresponding windows can be determined, but in this example only two have been selected.

Finally, in step 1510, the logical channels are preconfigured to correspond to the word lengths selected in steps 1502 to 1508. In the example described above, logical channel 0 is preconfigured to have an IQ word length of 10 bits (corresponding to an SNR of the received signal of greater than 18 dB), and logical channel 1 is preconfigured to have an IQ word length of 8 bits (corresponding to an SNR of the received signal of 18 dB or lower). This is achieved by programming the registers 1046 of FIG. 9 such that the value of 10 is programmed into the register corresponding to logical channel 0 and such that the value of 8 is programmed into the register corresponding to logical channel 1.

In some embodiments, the method of FIG. 11 is performed offline prior to operation of the mobile device 1002. In such embodiments, the steps of FIG. 11 may be performed by the designer implementing the digital interface 1008. In other embodiments, the method of FIG. 11 is performed by the BBIC 1004 prior to receiving the signal.

During operation, the method of FIG. 12 is then performed by the mobile device 1002.

In step 1522, the receive signal quality determiner 1042 obtains at least one parameter indicative of the quality of the received signal. In this illustrated example embodiment, the at least one parameter is the SNR of the received signal, which can be calculated using, for example, the received downlink pilot(s) or the BLER.

In step 1524, the SNR value is forwarded through the BBIC interface 1034 to the logical channel selector 1050 in the RFIC interface 1032. In one embodiment, this is achieved by embedding this information in a control signal sent over a control logical channel defined by the DigRF standard. In other embodiments, other means such as a physical wire or a non-DigRF message may be used to communicate the information from the receive signal quality determiner 1042 to the logical channel selector 1050.

In step 1526, the logical channel selector 1050 reads the SNR value from the receive signal quality determiner 1042 to determine whether the SNR is within the range corresponding to logical channel 0 or whether it is within the range corresponding to logical channel 1. That is, the logical channel selector determines whether the SNR of the received signal is greater than 18 dB threshold (corresponding to logical channel 0) or less than or equal to 18 dB threshold (corresponding to logical channel 1). If the SNR of the received signal is within the window corresponding to logical channel 0, then in step 1528 the logical channel selector 1050 instructs the RFIC interface encoder 1044 to map the I and Q words from digital front-end processing 1030 to logical channel 0. If the RFIC interface encoder 1044 is already mapping these I and Q words to logical channel 0, then no active action needs to be taken by the logical channel selector 1050. If the SNR of the received signal is within the window corresponding to logical channel 1, then in step 1530 the logical channel selector 1050 instructs the RFIC interface encoder 1044 to map the I and Q words from digital front-end processing 1030 to logical channel 1. Again, if the RFIC interface encoder 1044 is already mapping these I and Q words to logical channel 1, then no active action needs to be taken by the logical channel selector 1050. Thus, in some embodiments, in step 1526, once the logical channel selector 1050 decides whether it should select logical channel 0 or logical channel 1, it determines whether or not that channel is already selected, and if the channel is already selected, the logical channel selector 1050 takes no action.

It will be appreciated that in an alternative embodiment, the comparison described above in step 1526 could instead be made in the BBIC interface 1034, in which case, only an indication of which logical channel to select would be sent over the interface in step 1524 (rather than the SNR value). The logical channel selector 1050 would then simply ensure that the correct logical channel is selected as indicated by the BBIC interface 1034. Note that in an implementation in which one of the logical channels is a sub-data logical channel (SDLC), as defined by the DigRF interface, additional information relating to the amount of compression may also need to be transmitted in an extended frame header for each DigRF frame over the interface.

Next, in step 1532, steps 1522 to 1530 are repeated periodically during operation. For example, these steps may be repeated once every LTE subframe. In some embodiments, in order to ensure a clear demarcation between different data logical channels and assist in error recovery, logical channels are only switched at subframe boundaries, for example, right after a Rx time accurate stroke (TAS) message from the BBIC 1004 to the RFIC 1006. The Rx TAS is a special control channel message defined in DigRF standard and can be used for a timing reference. As such, the time duration between two consecutive switching points is an integer multiple of a specific time interval, within which the number of samples (or words) is fixed. The fixed number of samples within the specific time interval is known to the BBIC by design and can be used to assist in error checking in case the BBIC does not receive an expected number of samples between two consecutive switching points.

By performing the method of FIG. 12, the IQ word length is dynamically reduced to 8 bits when possible (e.g. when the SNR of the received signal is 18 dB or below in the present example). This can be done very efficiently during operation by simply switching between logical channel 0 and logical channel 1. As mentioned earlier, selecting a logical channel during operation simply involves setting the logical channel index 1059 in the header 1056 of each frame generated by the mapper 1048. Therefore, there is no need to re-configure a given logical channel during operation (which may interrupt operation), since dynamic reduction of IQ word length is achieved by simply switching to another preconfigured logical channel.

Also, the dynamic IQ word length reduction is for a given downlink receive channel (1014 to 1030). Other receive channels (e.g. corresponding to other antennas and/or RATs 1031) can also independently implement their own dynamic IQ word length reduction using the same method described above.

In some embodiments, logical channels 0 and 1 are both data logical channels in the DigRF interface. This has a benefit over using the sub-data logical channel (SDLC) defined in the DigRF interface, since the SDLC has additional overhead for implementing compression. However, the method described in FIG. 12 could instead be implemented using a data logical channel for one logical channel (say logical channel 0) and the SDLC for the other logical channel (say logical channel 1). A disadvantage of using the SDLC for logical channel 1 is that the SDLC requires additional overhead as data compression information in its header. However, a benefit of using the SDLC for logical channel 1 is that the number of bits used to represent the IQ word length in logical channel 1 can be further compressed, in the manner possible using the SDLC according to the DigRF standard, if the received SNR happens to be substantially lower than 18 dB (meaning an IQ word length of fewer than 8 bits can be used). The compression in these situations will result in additional power and bandwidth savings. In some embodiments, the compression is achieved as follows.

One byte from an SDLC frame payload is used to carry data compression information (CI), which may specify an effective IQ word length for the SDLC frame. To be specific, according to the DigRF standard (MIPI Alliance Specification for DigRF v4), the payload size of a data logical channel frame (DLC_SIZ) is given by $$DLC\_SIZ(bytes)=ceil((DLC\_IQ\_NUM+1)*(DLC\_IQ\_LEN+1)*2/8) \qquad (2)$$

where DLC_IQ_NUM is a data logical channel parameter and DLC_IQ_NUM+1 represents the configured number of IQ sample (word) pairs in each frame; DLC_IQ_LEN is another data logical channel and DLC_IQ_LEN+1 represents the configured IQ word length for each I or Q word; (DLC_IQ_NUM+1)*(DLC_IQ_LEN+1)*2 is a total number of bits being carried by (DLC_IQ_NUM+1) IQ pairs. The function ceil(x) denotes the smallest integer$\geq$x and it is used to make sure the payload size is an integer multiple of bytes. According to the DigRF standard, bits of zeros shall be padded at the end to reach this size.

For example, when DLC_IQ_LEN-+1=8 bits (configured IQ word length) and DLC_IQ_NUM+1=30 (IQ pairs), DLC_SIZ=60 bytes.

For an SDLC frame with one byte carrying the compression information specifying an effective IQ word length (CI_IQ_LEN+1) for the SDLC frame, the number of IQ pairs, denoted by SDLC_N_IQ_PAIR, is given by $$SDLC\_N\_IQ\_PAIR=floor((DLC\_SIZE-1)*8/((CI\_IQ\_LEN+1)*2)) \qquad (3)$$

where DLC_SIZE−1 with one byte carrying the compression information excluded is the number of bytes used to carry IQ pairs; (CI_IQ_LEN+1) is the effective IQ word length for the SDLC frame; (CI_IQ_LEN+1)*2 is the number of bits for one IQ word pair. The function floor(x) denotes the largest integer x.

In the implementation of interface mapping and demapping, the effective IQ word length CI_IQ_LEN is used instead of the configured DLC_IQ_LEN. As a result, when CL_IQ_LEN+1=8 bits (effective IQ word length), SDLC_N_IQ_PAIR=29 IQ word pairs; When CL_IQ_LEN+1=6 bits (effective IQ word length), SDLC_N_IQ_PAIR=39 IQ word pairs, meaning the data are further compressed such that more IQ word pairs are carried within one SDLC frame with the same payload size (DLC_SIZ).

Another benefit of using the SDLC for logical channel 1 is that in alternative embodiments, the effective IQ word length (CI_IQ_LEN+1) for logical channel 1 could be greater than the predetermined and configured word length (DLC_IQ_LEN+1) of logical channel 1. Then, during special circumstances in which a receive SNR of greater than 30 dB is required (e.g. in which the SNR is above the 30 dB threshold) and more bits for each I or Q word are required, logical channel 1 could be used to carry more bits for each I or Q word.

In alternative embodiments, the predetermined word length of logical channel 1 could be set to a value greater than the predetermined word length of logical channel 0 (e.g. logical channel 1 could be set to a 12 bit predetermined word length instead of an 8 bit predetermined word length). The effective IQ word length embedded in each SDLC frame would determine the actual number of bits for each I or Q word. As such, the number of bits for each I or Q word may be different from the predetermined number of bits for each I or Q word. An IQ word length of more than 10 bits can be used during special circumstances in which a receive SNR of greater than 30 dB is required. On the other hand, during circumstances in which the receive SNR is lower (e.g. below the 18 dB threshold), logical channel 1 could still be used, but with compression to reduce the word length to 8 bits or less. This allows for SNR ranges both above and below the typical 30 dB range associated with logical channel 0, but implemented using only one additional logical channel (logical channel 1 implemented by the SDLC).

It will be appreciated, though, that the benefits of using the SDLC as logical channel 1 need to be weighed against the additional overhead associated with the header of the SDLC, and a determination needs to be made on an implementation-by-implementation basis in order to determine whether using the SDLC as logical channel 1 would be beneficial.

Turning now to FIG. 13, the uplink (transmit path) is illustrated. After undergoing higher layer processing 1120, such as, for example, MAC processing and/or radio resource control layer processing, the digital information is modulated and encoded in modulator and encoder 1122. The output of modulator and encoder 1122 is the I and Q words to be transmitted over the wireless channel. Often, the IQ word length of these words is long in order to allow better precision during the baseband processing. In such cases, a truncater 1124 may truncate the IQ words in order to reduce their length prior to BBIC interface 1034.

Only one uplink transmit path is shown in FIG. 13. The illustrated transmit path is only one example, and it is specific to a particular channel and/or radio access technology (RAT). Other transmit paths (e.g. specific to other channels) are also fed into the BBIC interface 1034, as shown at 1135.

Once the digital I and Q words are transferred through the digital interface 1008, they are forwarded to digital-to-analog converter (DAC) 1126. The resulting analog signal then goes through analog processing, including low pass filtering 1128, up conversion 1130, bandpass filtering 1132, and power amplification 1134. The analog signal is then transmitted over the wireless channel via the one or more antennas 1014.

It will be appreciated that the RFIC 1006 and the BBIC signal processor 1010 may include other transmit signal processing, which has been omitted for the sake of clarity. Some of this additional signal processing may depend upon the particular type of signal being transmitted. For example, if the transmitted signal is an orthogonal frequency divisional multiplexing (OFDM) signal, there may be specific processing relating to resource element mapping and inverse fast fourier transformation (IFFT).

As shown in FIG. 13, the BBIC processor 1010 further includes a transmit signal quality determiner 1142, which determines at least one parameter indicative of the quality of the signal during transmission. In one embodiment, the parameter is the modulation scheme, which can change during transmission depending upon the location of the mobile device 1002. Typically, the base station will measure the quality of the uplink wireless channel via a sounding reference signal transmitted from the mobile device 1002, and if the uplink wireless channel is of low quality (for example, multipath fading resulting in a low receive SNR for the signal received at the base station), then the base station will instruct the mobile device 1002 to use a lower order modulation scheme (e.g. QPSK). The protocol or standard governing the transmission will specify a required transmit SNR for a particular modulation scheme. Typically, a lower order modulation scheme allows for a lower transmit SNR, which means a lower SQNR is possible (i.e. the IQ word length can be reduced). On the other hand, a higher order modulation scheme typically calls for a higher transmit SNR, which means a higher SQNR is required so that it is not a limiting factor on the transmit SNR. Thus, in some embodiments, the type of modulation scheme can be used as the at least one parameter indicative of the quality of the signal during transmission. In another embodiment, the at least one parameter is two parameters: the modulation scheme and the transmit power, which are also typically controlled by the base station (and may change) during transmission. As will be explained in more detail later, these two parameters can be used to determine a minimum required SQNR in the transmit path, which will determine the corresponding IQ word length necessary.

In other embodiments, the transmit signal quality determiner 1142 may determine and output other parameters relating to the quality of the transmitted signal, such as an SNR or SQNR, an SNR or error rate received from the base station, or information relating to the location of the mobile device in relation to the base station.

As will be discussed in more detail later, the output of the transmit signal quality determiner 1142 is forwarded to the interface 1008, which uses the information to determine whether the word length of the I and Q words can be reduced during transmission through the interface 1008.

It will be appreciated that the transmit signal quality determiner 1142 may be implemented in or by the same module as the receive signal quality determiner 1042 (e.g. in signal quality determiner 30).

The RFIC interface 1032 and the BBIC interface 1034 of the interface 1008 are shown in more detail in FIG. 14. After modulation and encoding 1122 (and possible truncation 1124), the I and Q digital words are forwarded to a BBIC digital interface encoder 1144. The BBIC digital interface encoder 1144 interfaces with a set of registers 1146, which define the plurality of logical channels (e.g. 8 logical channels). For example, there may be one register per logical channel. As discussed earlier, a logical channel defines the number of bits used to represent each I and Q word of the digital signal, i.e., the IQ word length. This parameter can be programmed in the register itself, and it is predetermined. For example, logical channel 0 may be preconfigured to have an IQ word length of 10 bits, logical channel 1 may be preconfigured to have an IQ word length of 8 bits, logical channel 2 may be preconfigured to have an IQ word length of 16 bits, and so on.

The I and Q words from modulator and encoder 1122 map to either logical channel 0 or logical channel 1, as selected by logical channel selector 1150. The I and Q words from the other channels 1135 are mapped to the other logical channels. Mapping the I and Q words to a specific logical channel comprises either zero-padding or (more likely) truncating the I and Q words in order to represent them using the predetermined word length associated with the logical channel.

As an example, assume logical channel 0 is preconfigured to define an IQ word length of 10 bits, and logical channel 1 is preconfigured to define an IQ word length of 8 bits. Thus, if logical channel 0 is selected during operation, the mapper 1148 maps each incoming digital I word and digital Q word from modulator and encoder 1122 to a 10 bit digital word. This is achieved by either truncating or zero-padding the incoming I and Q words. Note that it is unlikely that the mapper 1148 will need to zero-pad. Typically, the mapper 1148 will need to truncate the incoming I and Q words. This is because, as mentioned earlier, a longer IQ word length is usually used during the baseband processing. In some embodiments, the IQ word length after the possible truncator 1124 may still be larger than the IQ word length to be used.

Each IQ pair is also mapped by the mapper 1148 to a payload of a frame, such as the frame 1054 shown in FIG. 10. Each frame from the mapper 1148 is stored in one of the buffers 1152*a*-1152*n*. There is one buffer per uplink transmit path. Each frame corresponding to the I and Q words from modulator and encoder 1122 are stored in the buffer 1152*a*. Each one of the frames stored in buffer 1152*a* will have a header with a logical channel index of either 0 or 1, specifying whether the logical channel of the I and Q components of that frame is either logical channel 0 or logical channel 1. The data from the other channels 1135 are mapped to their respective logical channels and stored in buffers 1152*b*-1152*n*.

The data stored in each of the buffers 1152*a*-1152*n* is then transmitted serially in bursts over the physical channel 1036 (via the TxdataP and TxdataN pins). The multiplexer 1162 multiplexes the data from the buffers 1152*a*-1152*n* onto the physical channel 1036. As will be appreciated, the transmission rate of the data over the physical channel 1036 must on average be the same or faster than the sum of the individual rates at which frames are written to each of buffers 1152*a*-1152*n* in order to avoid continual buffer overflow.

The RFIC Interface 1032 includes an RFIC digital interface decoder 1164, which reads the header of each frame received over the physical channel 1036 and maps the payload of the frame to the appropriate channel based on the logical channel specified in the header. For example, when a frame is received by the RFIC digital interface decoder 1164 specifying a logical channel index of 0 or 1 in the header, the frame is mapped to channel 1168, which goes to DAC 1126. When other logical channel indices are read in the headers of other frames, these other frame are mapped to the receive paths of the other channels 1131.

Channel 1168 includes a merger 1165, which merges together I and Q words of different word lengths on channel 1168 so that the rest of the uplink transmit path in the RFIC 1006 is working with a consistent IQ word length. One way to achieve this is to simply concatenate all of the I and Q words received on either logical channel 0 or logical channel 1, and zero-pad the I and Q words having fewer bits. For example, assuming logical channel 0 defines an IQ word length of 10 bits and logical channel 1 defines an IQ word length of 8 bits, then the I and Q words on logical channel 1 would be zero-padded (by adding two zeros) in order to bring the IQ word length up to 10 bits. As discussed above, in some embodiments, the merger 1165 can also account for any implementation-specific delay variation of the digital words received from the decoder, and the merging can also assist in error recovery.

Preconfiguration of the logical channels and operation of the interface 1008 while transmitting data on the uplink will now be explained.

The logical channels are first preconfigured to each have a particular IQ word length in the manner described below.

Prior to operation, it is determined how many bits are necessary to represent each of the digital I and Q words in the digital interface 1008. As discussed earlier, the fewer the number of bits used to represent each word, the less power and bandwidth consumed transferring the words across the interface 1008. Therefore, it is desirable to use as few bits as possible to represent each I and Q word. However, the fewer the bits used, the greater the impact on the overall signal-to-noise ratio (SNR) of the transmitted signal. That is, using fewer bits to represent each I and Q word means that information is being discarded, which decreases the overall SNR of the transmitted signal. In other words, using fewer bits to represent each word effectively lowers the signal-to-quantization-noise ratio (SQNR), and the reduced SQNR will reduce the overall SNR of the transmitted signal. Therefore, it is also desirable to use as many bits as possible to represent each I and Q word.

Thus, the desired objective is to represent each of the I and Q words using fewer bits where possible, while striving to ensure that the SQNR is not a limiting factor in the overall SNR of the transmitted signal.

The higher the required SQNR, the greater the number of bits needed to represent each I and Q word. This means that during operation, if the SNR of the transmitted signal reduces or can be reduced, then the SQNR need not be as high (since the SNR is not as high), and fewer bits can be used to represent the I and Q words. On the other hand, if the SNR of the transmitted signal is high, then the SQNR needs to be higher (since the SNR is higher) so that the SQNR is not a limiting factor. In this situation, more bits are needed in order to represent each I and Q word.

Figure 15:
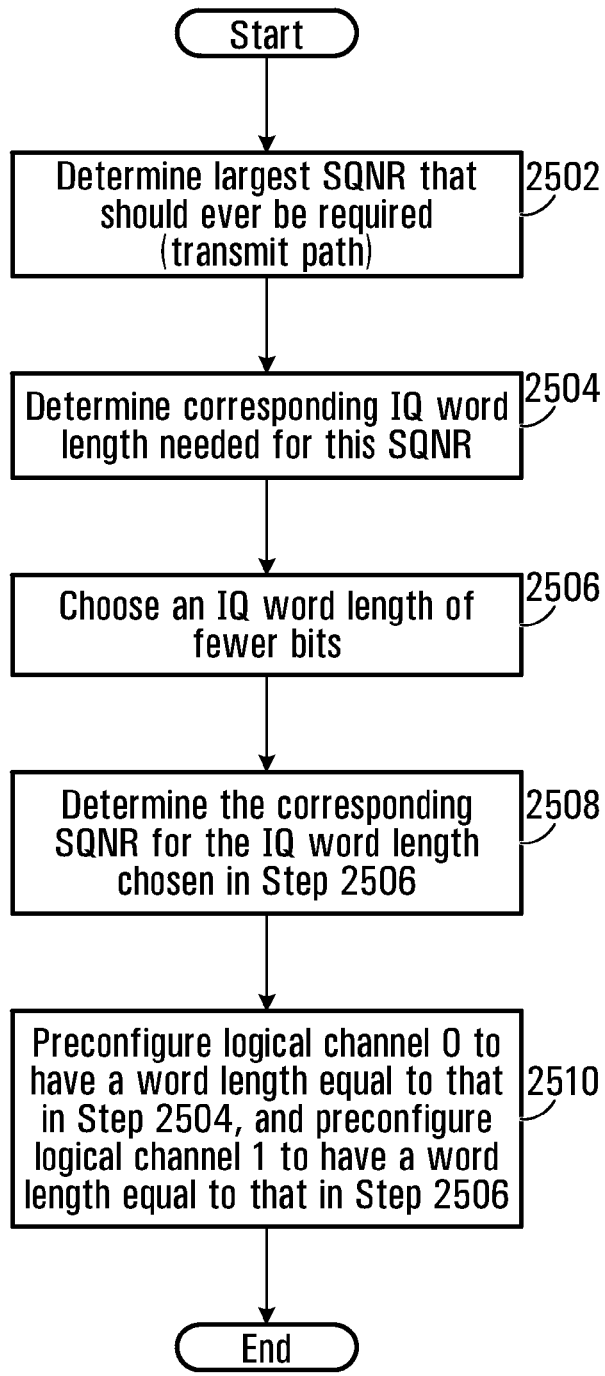
FIG. 15 is a flow diagram of a method of preconfiguring logical channels for data transmission through the digital interface.

Turning therefore to FIG. 15, logical channels 0 and 1 are preconfigured as follows.

In step 2502, the largest SQNR that should ever be required during operation is determined prior to operation. This value is implementation specific. As an example, let us assume that an SQNR of 46 dB is high enough not to be a limiting factor on the SNR of the transmitted signal, even when a high transmission power is required and/or a high order modulation scheme is being used, such that a high transmit SNR is required.

Then, in step 2504, the IQ word length needed in order to achieve this best-case SQNR is computed. Such a computation is known in the art. Let us assume (for the sake of example) that it is 10 bits. This means that it is always sufficient to use an IQ word length of 10 bits. Using a longer IQ word length is not necessary, as it will not have any noticeable impact on the overall required SNR of the transmit signal, even when the overall SNR is higher due to a higher transmission power and/or a higher order modulation scheme.

Next, in step 2506, an IQ word length of fewer bits is chosen, and in step 2508, the corresponding SQNR is calculated. The IQ word length chosen in step 2506 is again implementation specific and should correspond to a lower SQNR that is sufficient when the SNR of the transmitted signal is reduced.

As an example, assume an IQ word length of 8 bits is chosen in step 2506, which, for example, corresponds to an SQNR of 34 dB (calculated in step 2508 using known methods). Thus, if the required SQNR is higher than 34 dB, more than 8 bits should be used to represent the IQ word length, whereas, if the required SQNR is 34 dB or lower, then 8 bits is sufficient in order to represent the IQ word length.

Determining the required SQNR in the transmission path can be determined in different ways. In one embodiment, the required SQNR can be linked to the modulation scheme. For example, if 4-QAM (e.g. QPSK) is chosen, this indicates that the transmitted signal can be transmitted at a lower SNR, which means a lower SQNR is required, and hence fewer bits can be used to represent the IQ word length. In such an embodiment, the transmit signal quality determiner 1142 outputs the modulation scheme as its parameter indicative of the quality of the signal. However, as explained earlier, the modulation scheme alone is not necessarily indicative of the SNR of the transmitted signal and hence the required SQNR, as the SNR of the transmitted signal typically also depends upon the transmission power. For example, if the mobile device 1002 is at the edge of the cell, a low-order modulation scheme may be used (indicating a lower SNR of the transmitted signal), but the transmission power may be high (indicating a higher SNR of the transmitted signal, which may be needed in order to meet in-band and out-of-band emission requirements). Therefore, in other embodiments, the transmit signal quality determiner 1142 outputs the modulation scheme and the transmission power as its parameters indicative of the quality of the signal. As discussed earlier, the required SQNR can be calculated for a given modulation scheme and transmission power as follows:

(1) The required out-band SNR of the transmitted signal at the mobile device 1002 is computed from the out-of-band emission requirement specified in the protocol governing the transmission, and from the transmission power determined at the mobile device 1002. The transmission power is determined in accordance with the uplink power control specified in the protocol based on at least one of the device maximum transmit power capability, downlink path-loss, and other control parameters supplied by the base station. An implementation-specific margin can then be added to obtain the SQNR out-band component.

(2) The required in-band emission SNR of the transmitted signal is computed from the in-band emission requirement specified in the protocol governing the transmission in the unoccupied frequency portion. An implementation-specific margin can then be added to obtain the SQNR in-band emission component.

(3) The required in-band SNR of the transmitted signal is obtained based on the modulation scheme and the protocol governing the transmission. An implementation-specific margin can then be added to obtain the SQNR in-band component.

(4) The required SQNR is determined as the maximum of the SQNR out-band component, SQNR in-band emission component, and the SQNR in-band component.

In some embodiments, the implementation specific margin may be 5 dB for each of the SQNR out-band component, SQNR in-band emission component, and the SQNR in-band component, provided that the resulting SNR meets the requirements on the out-of-band emissions, in-band emissions, and in-band SNR at the transmit side.

In some embodiments, such calculations can be performed in advance for different combinations of modulation schemes and transmission powers scheduled to transmit, and a look-up table can be populated for use during operation. In other embodiments, these calculations are performed in the BBIC interface 1034 during operation.

By performing steps 2502 to 2508 of the method of FIG. 15, different ranges of required SQNRs (or equivalently, different modulation schemes and/or transmission powers) can be matched to different IQ word lengths. In the example described above, two IQ word lengths of 10 and 8 bits respectively are determined, and so there are two different ranges that can be matched to two different word lengths. Specifically, an IQ word length of 8 bits can be used for one set of modulation schemes and/or transmission powers that indicate a lower SNR of the transmit signal and thus a lower required SQNR, and an IQ word length of 10 can be used for the other modulation schemes and/or transmission powers that indicate a higher SNR of the transmit signal and thus a higher required SQNR.

It will be appreciated that other IQ word lengths and corresponding windows can be determined, but in this example only two have been selected.

Finally, in step 2510, the logical channels are preconfigured to correspond to the word lengths selected in steps 2502 to 2508. In the example described above, logical channel 0 is preconfigured to have an IQ word length of 10 bits (corresponding to one window of signal quality), and logical channel 1 is preconfigured to have an IQ word length of 8 bits (corresponding to another window of lower signal quality). This is achieved by programming the registers 1146 such that the value of 10 is programmed into the register corresponding to logical channel 0 and such that the value of 8 is programmed into the register corresponding to logical channel 1.

In some embodiments, the method of FIG. 15 is performed offline prior to operation of the mobile device 1002. In such embodiments, the steps of FIG. 15 may be performed by the designer implementing the digital interface 1008. In other embodiments, the method of FIG. 15 is performed by the BBIC 1004 prior to transmitting the signal.

Figure 16:
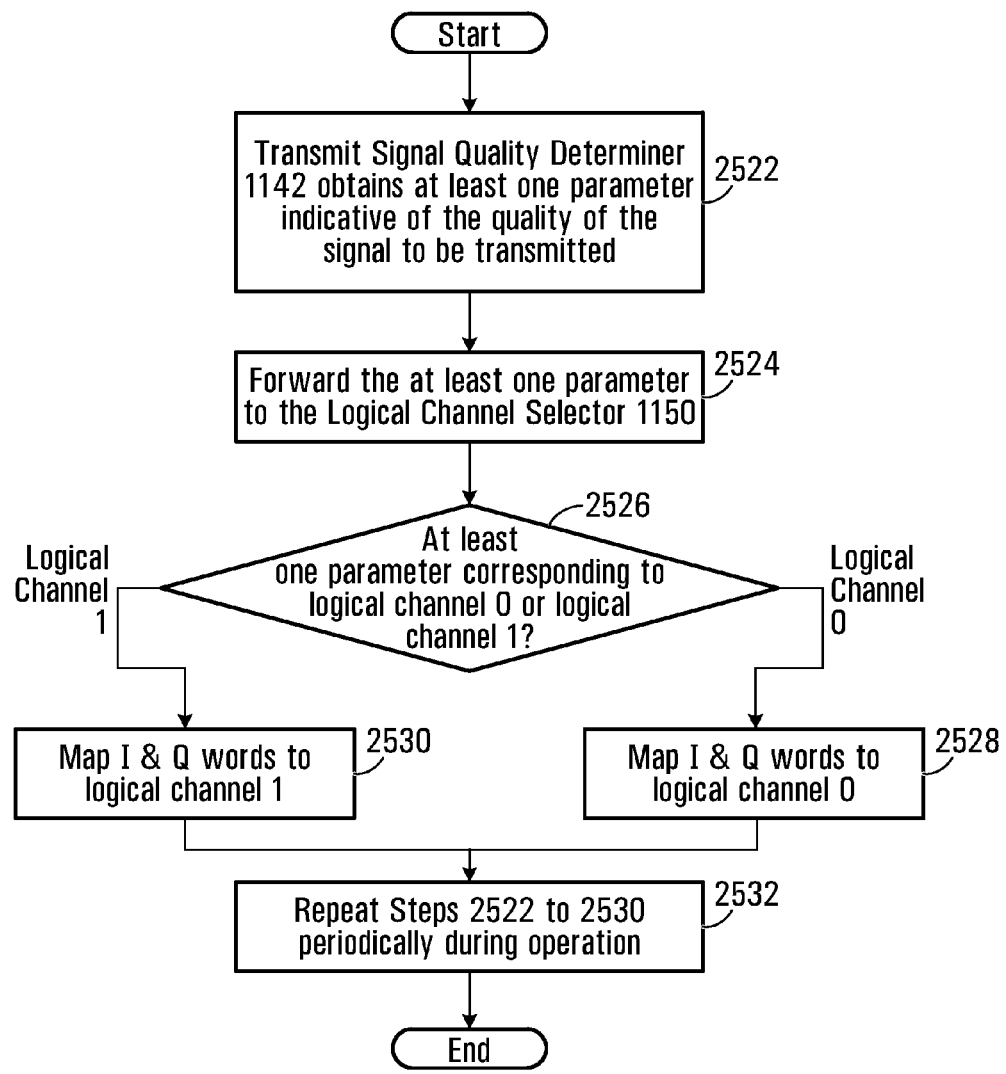
FIG. 16 is a flow diagram of a method of dynamically reducing the word length while transmitting a signal through of the digital interface.

During operation, the method of FIG. 16 is then performed by the mobile device 1002.

In step 2522, the transmit signal quality determiner 1142 obtains at least one parameter indicative of the quality of the signal (e.g. indicative of the SNR of the signal to be transmitted). As described above, the at least one parameter can be, for example: the modulation scheme, the transmission power, a combination of both, or an SNR or SQNR derived from these values.

In step 2524, this value is forwarded to the logical channel selector 1150 in the BBIC interface 1034.

In step 2526, the logical channel selector 1150 reads the value from the transmit signal quality determiner 1142 to determine whether logical channel 0 or logical channel 1 should be used. If the at least one parameter is indicative that the transmitted signal is within one window of quality such that logical channel 0 should be used (i.e. the quality of the signal is above a given threshold that bounds the window), then in step 2528 the logical channel selector 1150 instructs the BBIC interface encoder 1144 to map the I and Q words from modulator and encoder 1122 to logical channel 0. If the BBIC interface encoder 1144 is already mapping these I and Q words to logical channel 0, then no active action needs to be taken by the logical channel selector 1150. If the at least one parameter is indicative that the transmitted signal is in another window of quality such that logical channel 1 should be used (i.e. the quality of the signal is below the given threshold), then in step 2530 the logical channel selector 1150 instructs the BBIC interface encoder 1144 to map the I and Q words from modulator and encoder 1122 to logical channel 1. Again, if the BBIC interface encoder 1144 is already mapping these I and Q words to logical channel 1, then no active action needs to be taken by the logical channel selector 1150. Thus, in some embodiments, in step 2526, once the logical channel selector 1150 decides whether it should select logical channel 0 or logical channel 1, it determines whether or not that channel is already selected, and if the channel is already selected, the logical channel selector 1150 takes no action.

Next, in step 2532, steps 2522 to 2530 are repeated periodically during operation. For example, these steps may be repeated once every LTE subframe. In some embodiments, in order to ensure a clear demarcation between different data logical channels and assist in error recovery, logical channels are only switched at subframe boundaries, for example, right before a transmit time accurate stroke (TAS) message from the BBIC 1004 to the RFIC 1006. The transmit TAS is a special control channel message defined in DigRF standard and can be used for a timing reference. As such, the time duration between two consecutive switching points is an integer multiple of a specific time interval, within which the number of words is fixed. The fixed number of words within the specific time interval is known to the RFIC by design and can be used to assist in error checking in case the RFIC does not receive an expected number of words between two consecutive switching points.

By performing the method of FIG. 16, the IQ word length is dynamically reduced to 8 bits when possible (e.g. when the SNR of the transmitted signal is below a threshold). This can be done very efficiently during operation by simply switching between logical channel 0 and logical channel 1. As mentioned earlier, selecting a logical channel during operation simply involves setting the logical channel index in the header of each frame generated by the mapper 1148. Therefore, there is no need to re-configure a given logical channel during operation (which may interrupt operation), since dynamic reduction of IQ word length is achieved by simply switching to another preconfigured logical channel.

Also, the dynamic IQ word length reduction is for a given uplink transmit channel (1120 to 1034). Other transmit channels (e.g. channels 1135) can also independently implement their own dynamic IQ word length reduction using the same method described above.

In some embodiments, logical channels 0 and 1 are both data logical channels in the DigRF interface. However, the method described in FIG. 16 could instead be implemented using a data logical channel for one logical channel (say logical channel 0) and the SDLC for the other logical channel (say logical channel 1). The benefits and drawbacks of using the SDLC as one logical channel have already been discussed.

Figure 17:
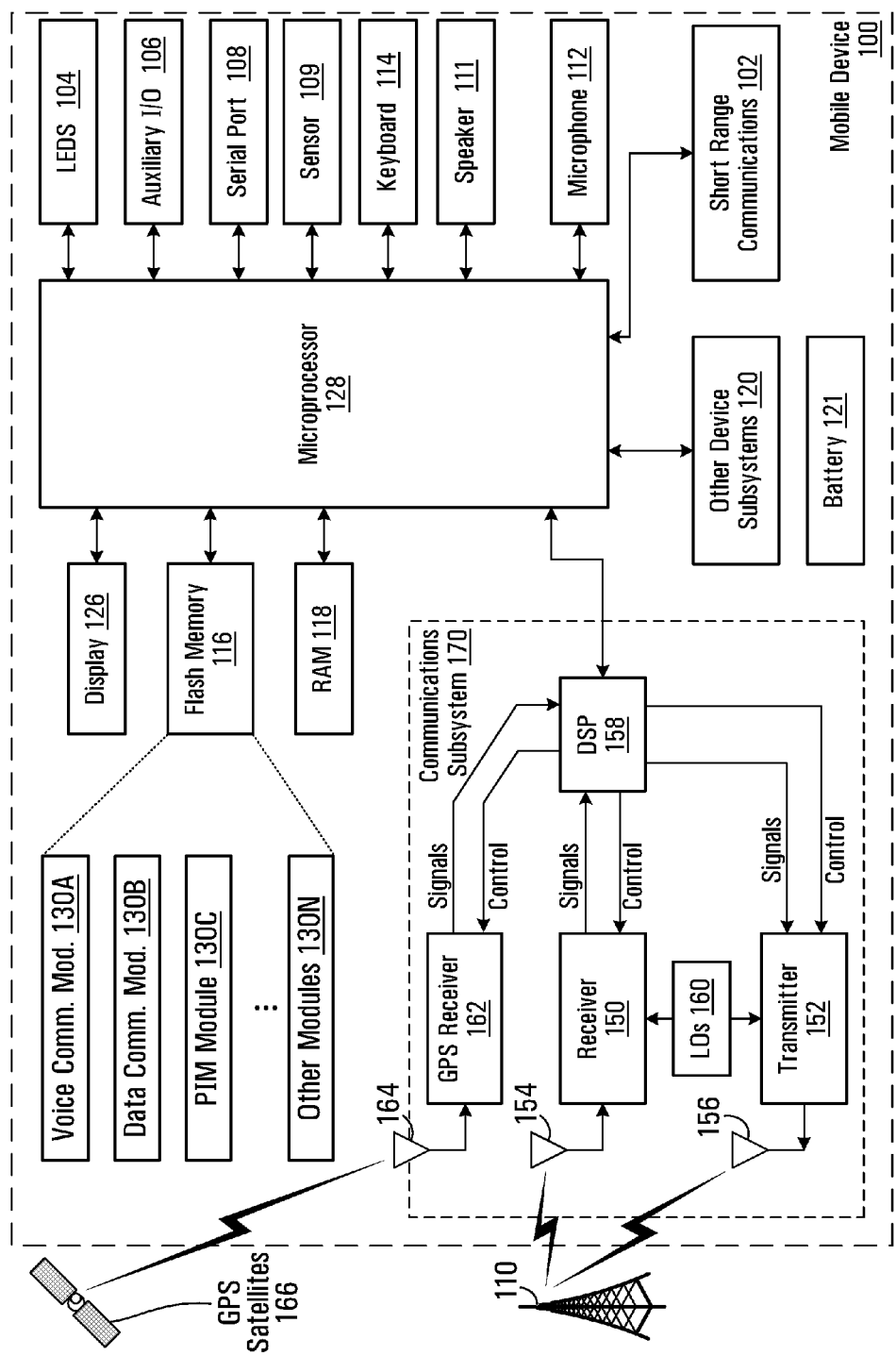
FIG. 17 is a block diagram of yet another mobile device.

Referring now to FIG. 17, a block diagram is shown of an embodiment of another mobile device 100 that may implement any of the device methods described herein. The mobile device 100 is shown with specific components for implementing features similar to those of the mobile device shown in FIGS. 1 and 7. It is to be understood that the mobile device 100 is shown with very specific details for exemplary purposes only.

The mobile device 100 has a housing that may be elongated vertically, or may take on other sizes and shapes (including clamshell housing structures). The keyboard 114 may include a mode selection key, or other hardware or software for switching between text entry and telephony entry. Alternatively, the mobile device 100 may have a housing that does not take on other sizes and shapes.

A microprocessor 128 is shown schematically as coupled between a keyboard 114 and a display 126. The microprocessor 128 controls operation of the display 126, as well as overall operation of the mobile device 100, in response to actuation of keys on the keyboard 114 by a user.

In addition to the microprocessor 128, other parts of the mobile device 100 are shown schematically. These include: a communications subsystem 170; a short-range communications subsystem 102; the keyboard 114 and the display 126, along with other input/output devices including a set of LEDs 104, a set of auxiliary I/O devices 106, a serial port 108, a speaker 111 and a microphone 112; as well as memory devices including a flash memory 116 and a Random Access Memory (RAM) 118; and various other device subsystems 120. The keyboard 114, speaker 111, microphone 112, display 126, and LEDs 104 are part of the user-interface.

The BBIC and RFIC interfaces discussed in FIGS. 8 to 16 may, for example, be part of communications subsystem 170.

The mobile device 100 may have a battery 121 to power the active elements of the mobile device 100. The mobile device 100 is in some embodiments a two-way radio frequency (RF) communication device having voice and data communication capabilities. In addition, the mobile device 100 in some embodiments has the capability to communicate with other computer systems via the Internet.

Operating system software executed by the microprocessor 128 is in some embodiments stored in a persistent store, such as the flash memory 116, but may be stored in other types of memory devices, such as a read only memory (ROM) or similar storage element. In addition, system software, specific device applications, or parts thereof, may be temporarily loaded into a volatile store, such as the RAM 118. Communication signals received by the mobile device 100 may also be stored to the RAM 118.

The microprocessor 128, in addition to its operating system functions, enables execution of software applications on the mobile device 100. A predetermined set of software applications that control basic device operations, such as a voice communications module 130A and a data communications module 130B, may be installed on the mobile device 100 during manufacture. In addition, a personal information manager (PIM) application module 130C may also be installed on the mobile device 100 during manufacture. The PIM application is in some embodiments capable of organizing and managing data items, such as e-mail, calendar events, voice mails, appointments, and task items. The PIM application is also in some embodiments capable of sending and receiving data items via a wireless network 110. In some embodiments, the data items managed by the PIM application are seamlessly integrated, synchronized and updated via the wireless network 110 with the device user's corresponding data items stored or associated with a host computer system.

Additional software modules, illustrated as another software module 130N, may be installed during manufacture.

Communication functions, including data and voice communications, are performed through the communication subsystem 170, and possibly through the short-range communications subsystem 102. The communication subsystem 170 includes a receiver 150, a transmitter 152, a GPS receiver 162, and one or more antennas, illustrated as a receive antenna 154, a transmit antenna 156, and a GPS antenna 164. In addition, the communication subsystem 170 also includes a processing module, such as a digital signal processor (DSP) 158, and local oscillators (LOs) 160. As mentioned above, the BBIC and RFIC interfaces discussed in FIGS. 8 to 16 may be part of communications subsystem 170.

The specific design and implementation of the communication subsystem 170 is dependent upon the communication network in which the mobile device 100 is intended to operate. For example, the communication subsystem 170 of the mobile device 100 may be designed to operate with the Mobitex™, DataTAC™ or General Packet Radio Service (GPRS) mobile data communication networks and also designed to operate with any of a variety of voice communication networks, such as Advanced Mobile Phone Service (AMPS), Time Division Multiple Access (TDMA), Code Division Multiple Access (CDMA), Personal Communications Service (PCS), Global System for Mobile Communications (GSM), etc. Examples of CDMA include 1× and 1×EV-DO. The communication subsystem 170 may also be designed to operate with an 802.11 Wi-Fi network, and/or an 802.16

WiMAX network. Other types of data and voice networks, both separate and integrated, may also be utilized with the mobile device 100.

Network access may vary depending upon the type of communication system. For example, in the Mobitex™ and DataTAC™ networks, mobile devices are registered on the network using a unique Personal Identification Number (PIN) associated with each device. In GPRS networks, however, network access is typically associated with a subscriber or user of a device. A GPRS device therefore typically has a subscriber identity module, (often referred to as a SIM card), in order to operate on a GPRS network.

When network registration or activation procedures have been completed, the mobile device 100 may send and receive communication signals over the communication network 110. Signals received from the communication network 110 by the receive antenna 154 are routed to the receiver 150, which provides for signal amplification, frequency down conversion, filtering, channel selection, etc., and may also provide analog to digital conversion. Analog-to-digital conversion of the received signal allows the DSP 158 to perform more complex communication functions, such as demodulation and decoding. In a similar manner, signals to be transmitted to the network 110 are processed (e.g., modulated and encoded) by the DSP 158 and are then provided to the transmitter 152 for digital to analog conversion, frequency up conversion, filtering, amplification and transmission to the communication network 110 (or networks) via the transmit antenna 156.

In addition to processing communication signals, the DSP 158 provides for control of the receiver 150, the transmitter 152, and the GPS receiver 162. For example, gains applied to communication signals in the receiver 150 and the transmitter 152 may be adaptively controlled through automatic gain control algorithms implemented in the DSP 158.

In a data communication mode, a received signal, such as a text message or web page download, is processed by the communication subsystem 170 and is input to the microprocessor 128. The received signal is then further processed by the microprocessor 128 for an output to the display 126, or alternatively to some other auxiliary I/O devices 106. A device user may also compose data items, such as e-mail messages, using the keyboard 114 and/or some other auxiliary I/O device 106, such as a touchpad, a rocker switch, a thumb-wheel, or some other type of input device. The composed data items may then be transmitted over the communication network 110 via the communication subsystem 170.

In a voice communication mode, overall operation of the device is substantially similar to the data communication mode, except that received signals are output to a speaker 111, and signals for transmission are generated by a microphone 112. Alternative voice or audio I/O subsystems, such as a voice message recording subsystem, may also be implemented on the mobile device 100. In addition, the display 126 may also be utilized in voice communication mode, for example, to display the identity of a calling party, the duration of a voice call, or other voice call related information.

Location determination using GPS technology involves receiving GPS signals from GPS satellites 166 on the antenna 164. The GPS signals are received using the GPS receiver 162 and processed by the DSP 158. Typically, GPS signals from at least four satellites are processed. Further details of GPS are known in the art and are omitted for simplicity.

The short-range communications subsystem 102 enables communication between the mobile device 100 and other proximate systems or devices, which need not necessarily be similar devices. For example, the short range communications subsystem may include an infrared device and associated circuits and components, or a Bluetooth™ communication module to provide for communication with similarly-enabled systems and devices.

Although the foregoing has been described with reference to certain specific embodiments, various modifications thereof will be apparent to those skilled in the art without departing from the scope of the claims appended hereto. As one example, having regard to the foregoing disclosure, it is straightforward to combine the systems and methods described above in order to provide enhanced functionality.

The invention claimed is:

1. A method of transmitting data through a digital interface, the method comprising:
    obtaining at least one parameter indicative of a quality of a signal;
    transmitting a frame by:
    if the at least one parameter indicates that the quality of the signal is above a threshold, then transmitting the data in the frame as a number of digital words at a first predetermined word length using a first preconfigured logical channel;
    if the at least one parameter indicates that the quality of the signal is below the threshold, then transmitting the data in the frame as a number of digital words at a second predetermined word length using a second preconfigured logical channel, the second predetermined word length different from the first predetermined word length; and
    indicating in the frame whether the first preconfigured logical channel is being used or whether the second preconfigured logical channel is being used.

2. The method of claim 1, wherein the second predetermined word length is less than the first predetermined word length.

3. The method of claim 1, wherein the quality of the signal is the signal-to-noise ratio (SNR) of the signal.

4. The method of claim 1, further comprising:
    receiving the signal from a wireless channel;
    extracting the digital words from the received signal;
    using the extracted digital words to obtain the at least one parameter indicative of the quality of the signal.

5. The method of claim 1, further comprising transmitting the digital words over a wireless channel on the signal; and wherein the at least one parameter indicative of the quality of the signal comprises at least one of: a modulation scheme, a transmission power, a value representative of the SNR of the transmitted signal, and a value representative of a signal-to-quantization-noise ratio (SQNR).

6. The method of claim 1, wherein the signal comprises the digital words.

7. The method of claim 6, wherein the method is performed on a mobile device, the signal is either received from a wireless channel or for transmission over a wireless channel, the digital words comprise in-phase and quadrature-phase components, and the digital interface is between a radio frequency integrated circuit (RFIC) and a baseband integrated circuit (BBIC).

8. The method of claim 7, wherein the interface is a DigRF interface.

9. The method of claim 8 wherein said indicating in the frame whether the first preconfigured logical channel is being used or whether the second preconfigured logical channel is being used comprises setting a logical index in a header of the frame, and wherein the frame is a DigRF frame.

10. The method of claim 1 further comprising: repeating the method on a periodic basis during said transmitting the data through the digital interface.

11. The method of claim 1 further comprising: if the at least one parameter indicates that the quality of the signal is below another threshold, then transmitting the data in the frame as a number of digital words at a third predetermined word length using a third preconfigured logical channel, the third predetermined word length different from both the first predetermined word length and the second predetermined word length.

12. A mobile device comprising:
a digital interface through which the mobile device is configured to transmit data;
a memory for storing a first predetermined word length corresponding to a first preconfigured logical channel and a second predetermined word length corresponding to a second preconfigured logical channel, the second predetermined word length being different from the first predetermined word length;
a signal quality determiner for determining at least one parameter indicative of a quality of a signal;
the mobile device for transmitting a frame by:
if the at least one parameter indicates that the quality of the signal is above a threshold, then selecting the first preconfigured logical channel such that the data is transmitted in the frame as a number of digital words at the first predetermined word length;
if the at least one parameter indicates that the quality of the signal is below the threshold, then selecting the second preconfigured logical channel such that the data is transmitted in the frame as a number of digital words at the second predetermined word length;
indicating in the frame whether the first preconfigured logical channel is being used or whether the second preconfigured logical channel is being used.

13. The mobile device of claim 12, wherein the second predetermined word length is less than the first predetermined word length.

14. The mobile device of claim 12, wherein the quality of the signal is the signal-to-noise ratio (SNR) of the signal.

15. The mobile device of claim 12, further comprising:
an antenna for receiving the signal from a wireless channel;
processing circuitry for extracting the digital words from the received signal and for using the extracted digital words to obtain the at least one parameter indicative of the quality of the signal.

16. The mobile device of claim 12, further comprising an antenna for transmitting the digital words over a wireless channel on the signal; and wherein the at least one parameter indicative of the quality of the signal comprises at least one of: a modulation scheme, a transmission power, a value representative of the SNR of the transmitted signal, and a value representative of a signal-to-quantization-noise ratio (SQNR).

17. The mobile device of claim 12, wherein the signal comprises the digital words.

18. The mobile device of claim 12, further comprising:
an antenna for at least one of (i) receiving the signal from a wireless channel and (ii) transmitting the signal over the wireless channel;
a radio frequency integrated circuit (RFIC) and a baseband integrated circuit (BBIC), wherein the digital interface is a DigRF interface between the RFIC and the BBIC;
wherein the digital words comprise in-phase and quadrature-phase components;
wherein the mobile device is for indicating in the frame whether the first preconfigured logical channel is being used or whether the second preconfigured logical channel is being used by setting a logical index in a header of the frame, and wherein the frame is a DigRF frame.

19. A non-transitory computer readable medium having stored thereon computer readable instructions for performing a method of transmitting data through a digital interface; the computer readable instructions, when executed by a device, cause the device to perform operations comprising:
obtaining at least one parameter indicative of a quality of a signal;
transmitting a frame by:
if the at least one parameter indicates that the quality of the signal is above a threshold, then transmitting the data in the frame as a number of digital words at a first predetermined word length using a first preconfigured logical channel;
if the at least one parameter indicates that the quality of the signal is below the threshold, then transmitting the data in the frame as a number of digital words at a second predetermined word length using a second preconfigured logical channel, the second predetermined word length different from the first predetermined word length; and
indicating in the frame whether the first preconfigured logical channel is being used or whether the second preconfigured logical channel is being used.

20. The non-transitory computer readable medium of claim 19, wherein: the signal comprises the digital words, the second predetermined word length is less than the first predetermined word length, the signal is either received from a wireless channel or for transmission over a wireless channel, the digital words comprise in-phase and quadrature-phase components, the digital interface is a DigRF interface between a radio frequency integrated circuit (RFIC) and a baseband integrated circuit (BBIC); and wherein said indicating in the frame whether the first preconfigured logical channel is being used or whether the second preconfigured logical channel is being used comprises setting a logical index in a header of the frame, and wherein the frame is a DigRF frame.

* * * * *